United States Patent
Hayashi et al.

(10) Patent No.: US 12,340,970 B2
(45) Date of Patent: Jun. 24, 2025

(54) CHARGED PARTICLE BEAM DEVICE, AND METHOD FOR CONTROLLING CHARGED PARTICLE BEAM DEVICE

(71) Applicant: HITACHI HIGH-TECH CORPORATION, Tokyo (JP)

(72) Inventors: Shingo Hayashi, Tokyo (JP); Hideyuki Kazumi, Tokyo (JP); Zhaohui Cheng, Tokyo (JP); Hideto Dohi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 509 days.

(21) Appl. No.: 17/914,488

(22) PCT Filed: May 13, 2020

(86) PCT No.: PCT/JP2020/019166
§ 371 (c)(1),
(2) Date: Sep. 26, 2022

(87) PCT Pub. No.: WO2021/229732
PCT Pub. Date: Nov. 18, 2021

(65) Prior Publication Data
US 2023/0113759 A1 Apr. 13, 2023

(51) Int. Cl.
*H01J 37/141* (2006.01)
*H01J 37/147* (2006.01)
*H01J 37/153* (2006.01)
*H01J 37/28* (2006.01)

(52) U.S. Cl.
CPC .......... *H01J 37/141* (2013.01); *H01J 37/153* (2013.01); *H01J 37/28* (2013.01); *H01J 37/1475* (2013.01); *H01J 2237/1405* (2013.01); *H01J 2237/1532* (2013.01); *H01J 2237/2448* (2013.01)

(58) Field of Classification Search
CPC ........ H01J 37/141; H01J 37/153; H01J 37/28; H01J 37/1475; H01J 2237/1405; H01J 2237/1532; H01J 2237/2448
See application file for complete search history.

(56) References Cited

FOREIGN PATENT DOCUMENTS

| JP | 2013-065484 A | 4/2013 |
| JP | 2013-239329 A | 11/2013 |
| WO | 2018123063 A1 | 7/2018 |

OTHER PUBLICATIONS

Search Report mailed Jul. 21, 2020 in International Application No. PCT/JP2020/019166.
Written Opinion mailed Jul. 21, 2020 in International Application No. PCT/JP2020/019166.

*Primary Examiner* — David E Smith
*Assistant Examiner* — Hanway Chang
(74) *Attorney, Agent, or Firm* — Miles & Stockbridge, P.C.

(57) ABSTRACT

The present invention has been made in view of the above problems, and an object thereof is to provide a charged particle beam device capable of improving the reproducibility of the magnetic field response of a magnetic field lens and realizing highly-accurate electron orbit control in a short time. A charged particle beam device according to the present invention generates an excitation current of a magnetic field lens by combining a direct current with an alternating current (see FIG. 6A).

14 Claims, 25 Drawing Sheets

CHARGED PARTICLE BEAM DEVICE, AND METHOD FOR CONTROLLING CHARGED PARTICLE BEAM DEVICE

TECHNICAL FIELD

The present invention relates to a charged particle beam device.

BACKGROUND ART

Demand for miniaturization of semiconductor devices is increasing as AI, IoT, and on-vehicle devices become rapidly sophisticated. In particular, starting with the progress of the extreme ultra violet exposure technology, the development of miniaturized devices and new materials having a size of 10 nm or less has accelerated. With these changes in the semiconductor market, a scanning electron microscope (SEM) is becoming increasingly important as a charged particle beam device for inspecting and measuring a sample in manufacturing processes. In particular, demand for improvement of measurement accuracy and short-time measurement is high, and highly-accurate electron orbit control is important for realization.

Patent Literature 1 discloses, as a method of relaxing the hysteresis of a magnetic field lens, "a method of adjusting a charged particle optical system for guiding a charged particle beam emitted from a charged particle beam source onto a predetermined sample by using a magnetic field lens, wherein a stabilized hysteresis loop is formed in a major loop in a hysteresis curve of the magnetic field lens by applying an AC excitation current having a single amplitude to the magnetic field lens in a non-irradiation state of the charged particle beam" (Claim 1).

Patent Literature 2 discloses, as a method of adjusting the profile of electrons emitted from a sample, "provided are an ExB deflector 101 having 8 or more poles of electric field type deflectors and magnetic field type deflectors, first ratio and strength adjusting means 110, and second ratio and strength adjusting means 111. The first ratio and strength adjusting means 110 adjusts the ratio and strength of a dipole electric field and a dipole magnetic field generated by the ExB deflector 101, and the second ratio and strength adjusting means 111 adjusts the ratio and strength of a quadrupole electric field and a quadrupole magnetic field generated by the ExB deflector 101" (Abstract).

CITATION LIST

Patent Literature

Patent Literature 1: Japanese Unexamined Patent Application Publication No. 2013-065484
Patent Literature 2: Japanese Unexamined Patent Application Publication No. 2013-239329

SUMMARY OF INVENTION

Technical Problem

Patent Literature 1 discloses a method of memorizing a magnetic field response to current paths in a wide area by applying a high-load alternating current to a magnetic field lens. The accuracy of focus adjustment can be enhanced by applying the same technology to a round lens, and the accuracy of visual field movement can be enhanced by applying the same technology to a deflection lens. These improve measurement accuracy. On the other hand, in the case where an excitation current in the direction opposite to the memorized current path is applied, current control for circulating the current path in a wide area is required, and a new problem that time is required before measurement arises.

Patent Literature 2 discloses a method of correcting the profile of electrons emitted from a sample by using divided lenses. Accordingly, blurring of an observation image can be corrected, and measurement accuracy is improved. On the other hand, since the divided lenses exhibit different magnetic characteristics, a new problem that control is difficult and time is required before measurement arises. In addition, since the lenses are magnetically coupled to each other when the distance between the lenses is narrow, a new problem that control is difficult and time is required before measurement arises.

The present invention has been made in view of the above problems, and an object thereof is to provide a charged particle beam device capable of improving the reproducibility of the magnetic field response of a magnetic field lens and realizing highly-accurate electron orbit control in a short time.

Solution to Problem

A charged particle beam device according to the present invention generates an excitation current of a magnetic field lens by combining a direct current with an alternating current.

Advantageous Effects of Invention

According to the charged particle beam device of the present invention, it is possible to provide a technology capable of improving the reproducibility of the magnetic field response of a magnetic field lens and realizing highly-accurate electron orbit control in a short time. Problems, configurations, and effects other than those described above will be clarified by the description of the following embodiments.

DESCRIPTION OF EMBODIMENTS

First Embodiment

In a first embodiment of the present invention, a technique capable of improving the reproducibility of the magnetic field response of a round lens and realizing highly-accurate focus adjustment in a short time will be described. A scanning electron microscope will be described as an example of a charged particle beam device.

Figure 1:
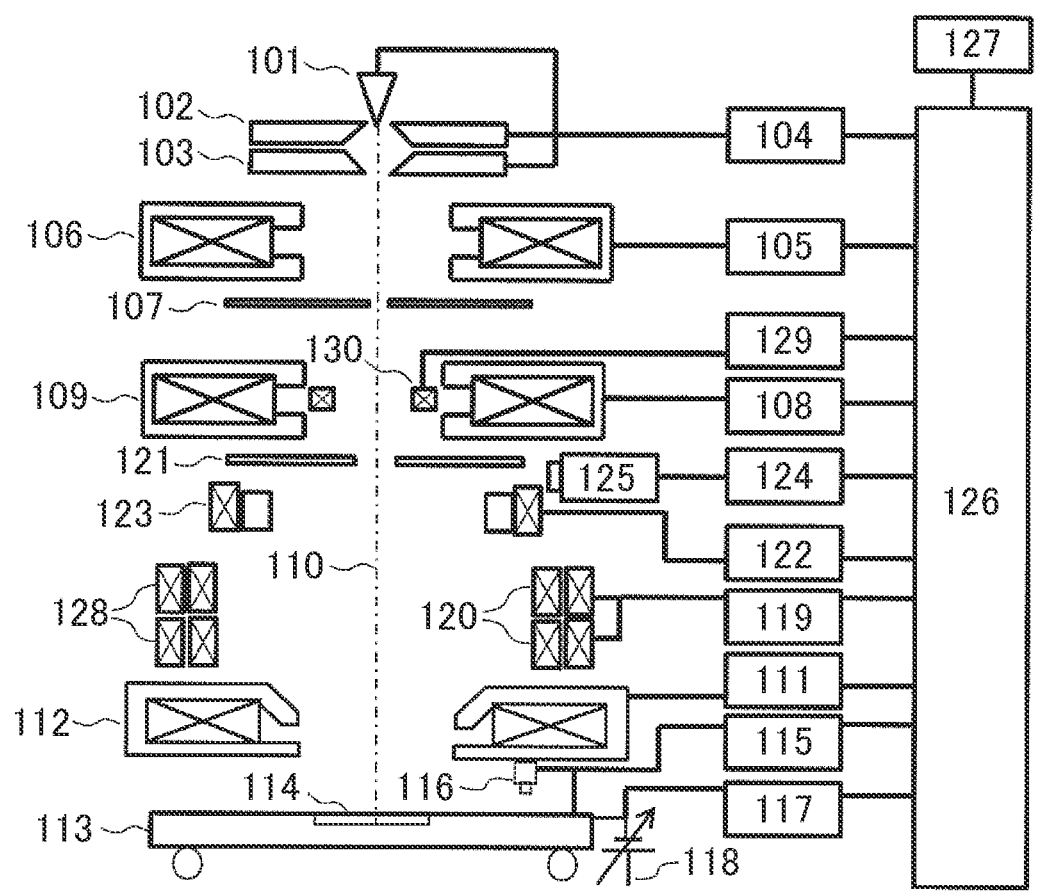
FIG. 1 is a schematic diagram of a scanning electron microscope.

FIG. 1 is a schematic diagram of a scanning electron microscope. A cathode 101, a first anode 102, and a second anode 103 configure a charged particle source (electron gun), and are controlled by an electron gun control unit 104. When the electron gun control unit 104 applies an extraction voltage between the cathode 101 and the first anode 102, primary electrons are emitted from the cathode 101 at a predetermined current density. Further, the primary electrons are accelerated and emitted to the subsequent stage by an acceleration voltage applied between the cathode 101 and the second anode 103.

The emitted primary electrons are focused by a first condenser lens 106. The excitation current of the first condenser lens 106 is controlled by a first condenser lens control unit 105. The primary electrons focused by the first condenser lens 106 are limited to a predetermined current amount at an opening of an objective movable diaphragm 107. The primary electrons having passed through the objective movable diaphragm 107 are focused to an appropriate position on an optical axis 110 by a second condenser lens 109. The excitation current of the second condenser lens 109 is controlled by a second condenser lens control unit 108. The primary electrons focused by the second condenser lens 109 are focused to a sample 114 arranged on a stage 113 by an objective lens 112. The excitation current of the objective lens 112 is controlled by an objective lens control unit 111. The excitation current of the objective lens 112 is set on the basis of the working distance measured by a sample height measuring apparatus 116. The sample height measuring apparatus 116 is controlled by a stage control unit 115. A retarding power supply 118 controlled by a retarding voltage control unit 117 is connected to the stage 113. The primary electrons are decelerated by generating a voltage between the objective lens 112 and the sample 114 by the retarding power supply 118.

A first scanning deflector 120 two-dimensionally scans the primary electrons on the sample 114. The first scanning deflector 120 is controlled by a first deflector control unit 119. Secondary electrons are generated by the interaction between the primary electrons and the sample 114. The generated secondary electrons pass through the objective lens 112 to forma spot spreading on a secondary electron conversion plate 121. The first scanning deflector 120 scans the secondary electrons on the secondary electron conversion plate 121, and tertiary electrons are generated by the interaction with the secondary electron conversion plate 121. The tertiary electrons are deflected in the direction of a detector 125 controlled by a detector control unit 124 by an ExB lens 123 whose applied voltage and excitation current are controlled by an ExB control unit 122, and are detected by the detector 125. The detected tertiary electrons are converted into electrical signals, which are operated by a control unit 126 and displayed as an SEM images on a display device 127. By making the ExB lens 123 into a multipole structure, the control unit 126 can correct the aberration (astigmatism, chromatic aberration, deflection distortion, and the like) generated when the electrons are deflected from the optical axis 110. The details will be described later. In the case where the visual field of the SEM image is moved, the stage control unit 115 moves the stage 113, or an image shift deflector 128 moves the irradiation position of the primary electrons on the sample 114. The image shift deflector 128 is controlled by the first deflector control unit 119. An astigmatic corrector 130 corrects the parasitic astigmatism of the electron optical system. The astigmatic corrector 130 is controlled by an astigmatic corrector control unit 129.

Figure 2:
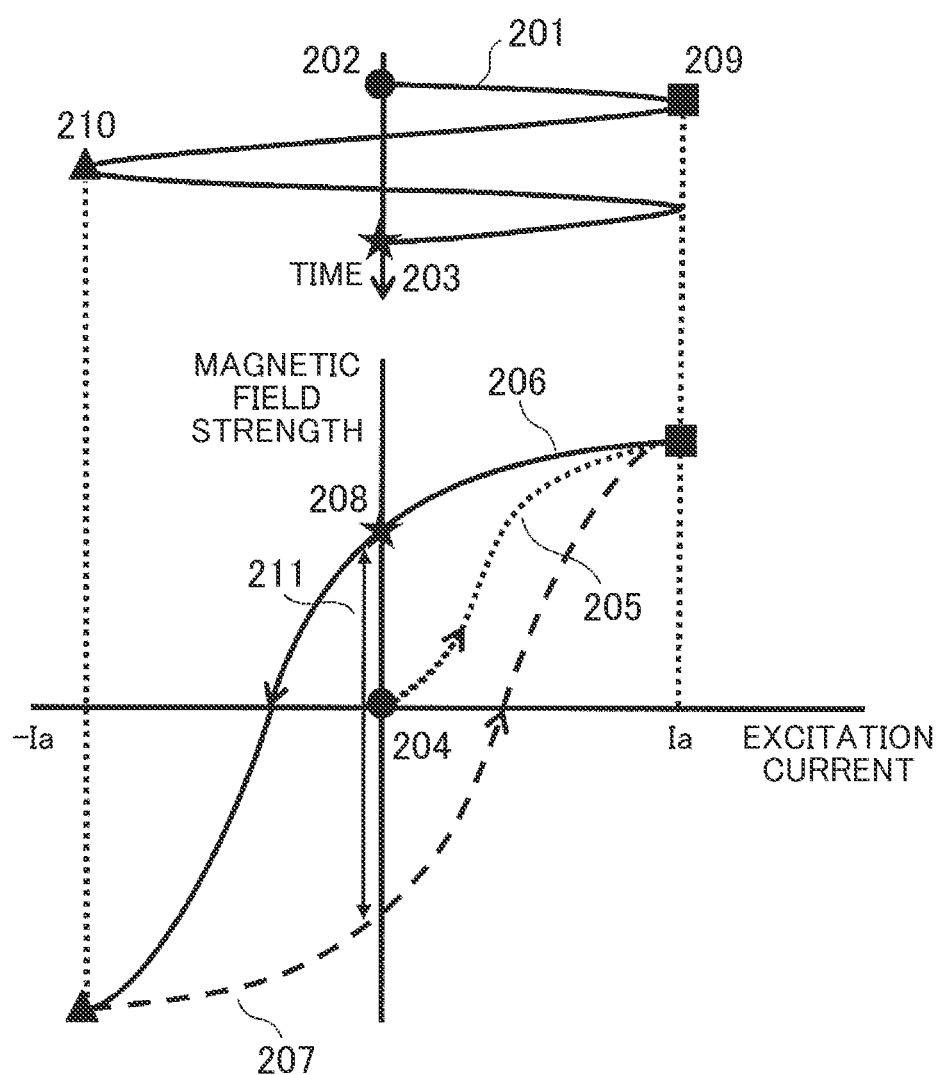
FIG. 2 is an example of the magnetic field response of a magnetic field lens.

FIG. 2 is an example of the magnetic field response of a magnetic field lens. The magnetic field response is the relationship between a current value and magnetic field strength. The magnetic field lens is an electromagnet that changes the magnetic field strength by an excitation current, for example, a round lens such as a condenser lens or an objective lens, a deflection lens such as a deflector or an image shift deflector, an E×B lens, a multipole lens for stigma adjustment, or the like.

The excitation current of the magnetic field lens is applied along a current path 201 from a start point 202 of the excitation current to an end point 203 of the excitation current. At this time, the magnetic field strength of the magnetic field lens follows an initial magnetization curve 205 shown by a dotted line from a start point 204 of the magnetic field strength, and then follows a first excitation path 206 shown by a solid line. Next, after following a second excitation path 207 shown by a broken line, the magnetic field strength follows the first excitation path 206 again to reach an end point 208 of the excitation strength.

When the difference between the maximum excitation current 209 and the minimum excitation current 210 in the excitation path 201 is large and the magnetic field lens is heavily loaded, the magnetic field response is different between when (first excitation path 206) the excitation current is reduced and when (second excitation path 207) the excitation current is increased. As a result, the deviation (so-called output offset 211) of the magnetic field strengths of the two occurs. The maximum excitation current 209 and the minimum excitation current 210 are generally set in a wider area than the target current for outputting the desired magnetic field strength after focus adjustment, visual field movement, or the like is performed.

Figure 3:
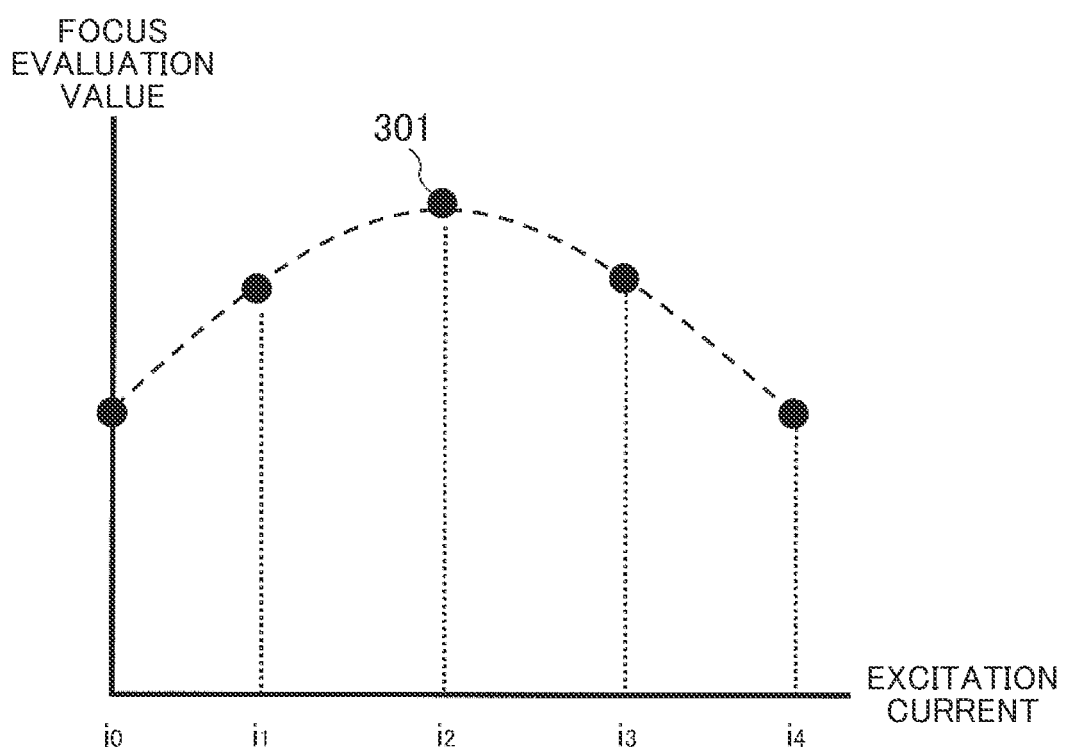
FIG. 3 is a diagram for showing an example of focus adjustment using an objective lens 112.

FIG. 3 is a diagram for showing an example of focus adjustment using the objective lens 112. In the focus adjustment using the objective lens 112, the excitation current of the objective lens 112 is adjusted so that the observation image becomes the highest definition. First, the excitation current of the objective lens 112 is swept to i0 to i4. At this time, the observation image is photographed with each excitation current. Next, a focus evaluation filter (differential, secondary differential, Sobel, Laplacian, Fourier transform, or the like) is applied to each photographed SEM image to create a focus evaluation image, and a focus evaluation value (also referred to as sharpness) is calculated. As the focus evaluation value, the sum of all the pixel values of the focus evaluation image, the average value of all the pixel values, the dispersion value of all the pixel values, and the like can be used. Finally, the excitation current is changed to the excitation current i2 of the maximum focus evaluation value 301.

Figure 4:
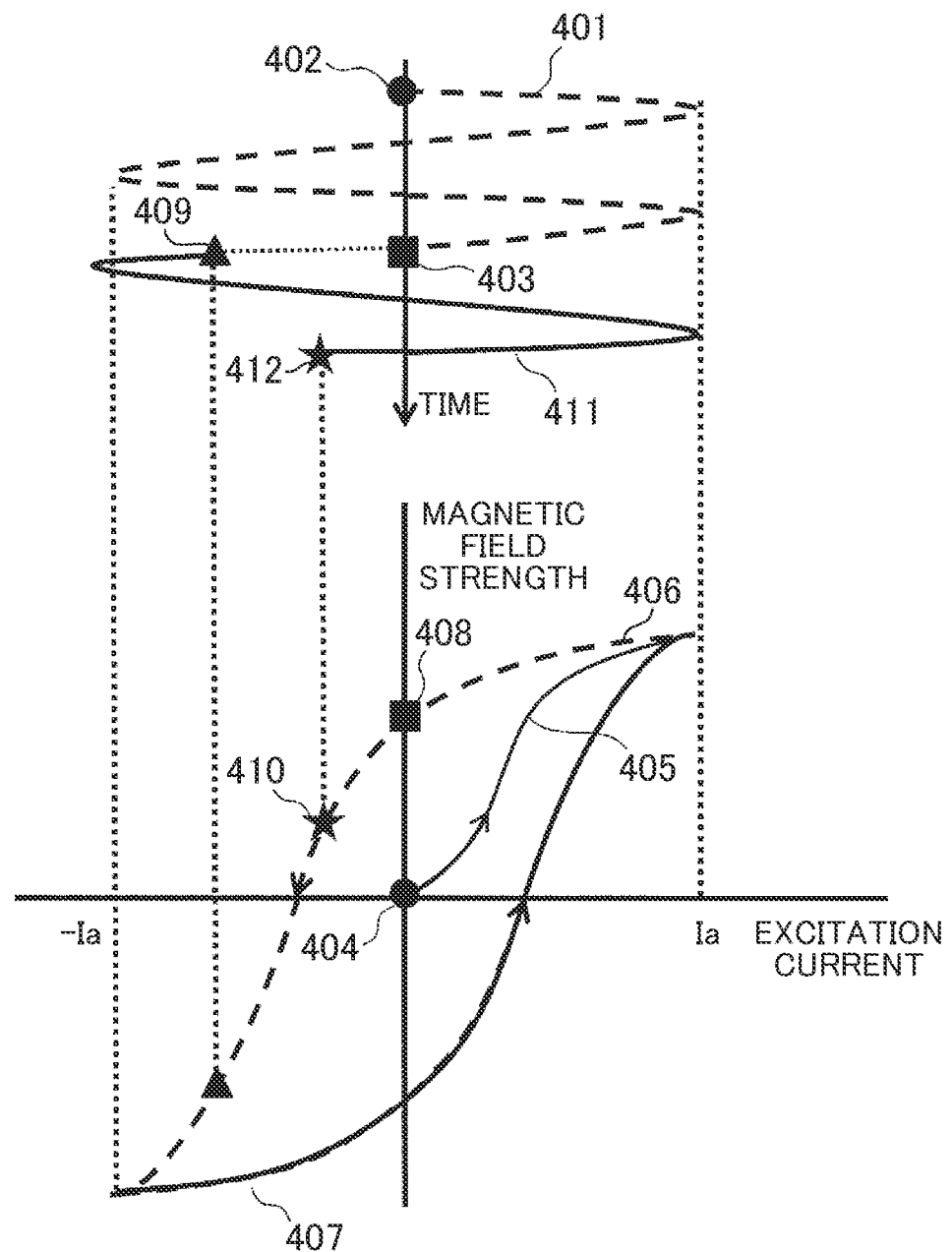
FIG. 4 is a diagram for showing an example of a problem of the focus adjustment using the objective lens 112.

FIG. 4 is a diagram for showing an example of a problem of the focus adjustment using the objective lens 112. In the focus adjustment, a procedure of stabilizing the magnetic field response of the objective lens 112 and then searching for an optimum focus position is generally performed.

First, in order to stabilize the magnetic field response of the objective lens 112, an alternating current is applied from a start point 402 of the excitation current to an end point 403 of the excitation current along an alternating current path 401 in which the excitation current is shown by a broken line. The amplitude of the alternating current is generally set to be sufficiently larger than the target current to be the optimum focus position. At this time, the magnetic field strength of the objective lens 112 follows an initial magnetization curve 405 from a start point 404 of the magnetic field strength, and then follows a first excitation path 406. Next, after following a second excitation path 407, the magnetic field strength follows the first excitation path 406 again to reach an end point 408 of the excitation strength. As a result, the relationship between the current path applied in the past and the magnetic field strength is memorized, and the reproducibility of the magnetic field response is improved. That is, this state is referred to as the stabilized magnetic field response.

Next, in order to search for the optimum focus position, a plurality of observation images is photographed in the middle while linearly sweeping the value of the excitation current from the end point 403 of the excitation current to an end point 409 of the focus adjustment, and the focus evaluation value of each photographed SEM image is measured. In the case where the magnetic field strength having the highest focus evaluation value is the magnetic field strength 410, the excitation current of the objective lens 112 is changed to the final excitation current 412 along a current path 411 shown by a solid line.

As described above, when an alternating current having an amplitude larger than the target current is applied to the objective lens 112, the relationship between the excitation current path applied in the past and the magnetic field strength is reproduced, so that the accuracy of the focus adjustment is enhanced. While this advantage is provided, if the target current is exceeded when sweeping on the memorized current path, current control for circulating the current path in a wide area is required, and thus a new problem requiring time for adjustment arises. That is, even though the optimum magnetic field strength 410 is obtained between the end point 403 of the excitation current and the end point 409 of the focus adjustment, the current path from the end point 409 to the final excitation current 412 is traced, so that an extra adjustment time is required.

Next, the relationship between the amplitude of the alternating current and the output offset will be described with reference to FIG. 2 and FIG. 5. As shown in FIG. 2, when an alternating current is applied to the magnetic field lens, output offset 211 occurs. The magnitude of the output offset 211 changes according to the amplitude of the alternating current.

Figure 5:
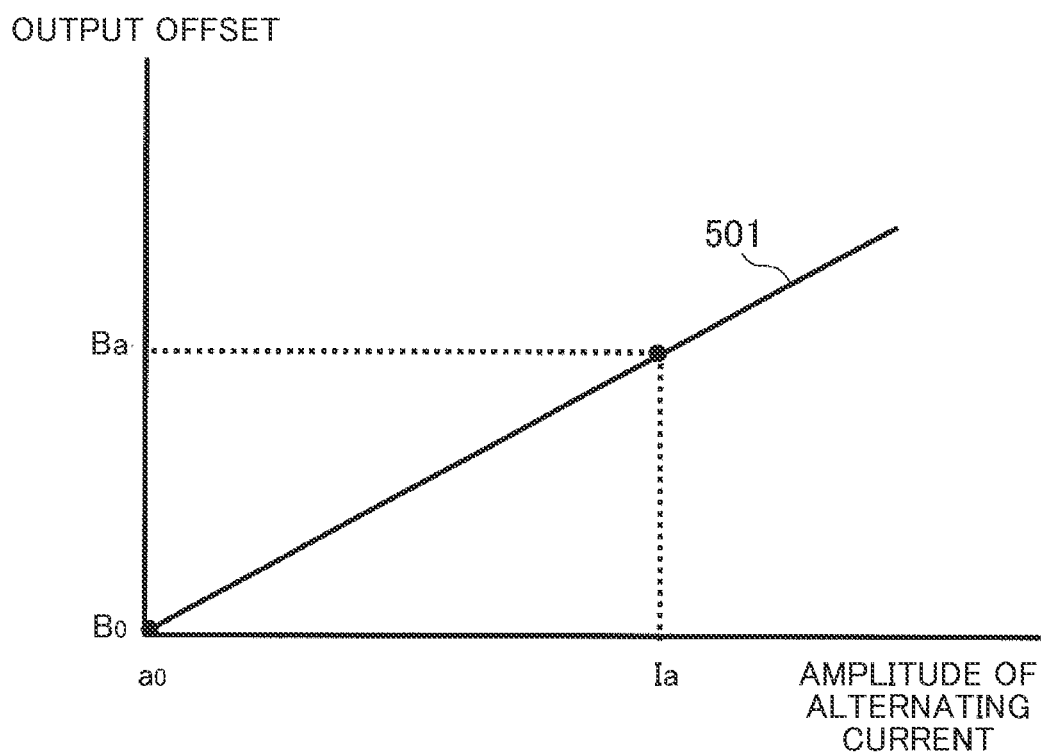
FIG. 5 is a diagram for explaining the relationship between the amplitude of an alternating current and output offset 211.

FIG. 5 is a diagram for explaining the relationship between the amplitude of the alternating current and the output offset 211. As shown in a characteristic 501 of FIG. 5, the output offset 211 becomes small when the amplitude of the alternating current is reduced. Therefore, if the relationship between the current path and the magnetic field strength is memorized with the amplitude (a0«Ia) of the alternating current at which the output offset is minimized (B0«Ba), the deviation between the first excitation path 206 and the second excitation path 207 is suppressed, and the output offset 211 can be minimized to a negligible extent.

The amplitude of the alternating current at which the output offset 211 is minimized differs for each magnetic field lens. For example, in the case of a round lens such as a condenser lens or an objective lens, it is preferable to set the amplitude so that a change in the sharpness of the observation image occurring before and after applying the alternating current can be neglected. In the case of an axially asymmetrical lens such as a deflection lens or a multipole lens such as stigma, it is preferable to set the amplitude so that the observation image shift occurring before and after applying the alternating current can be neglected. More specifically, it is preferable that the observation image shift occurring before and after applying the alternating current is measured using an analysis method such as template matching, and the observation image shift is within ±2 pix. This setting allows the output offset to be neglected.

Figure 6A:
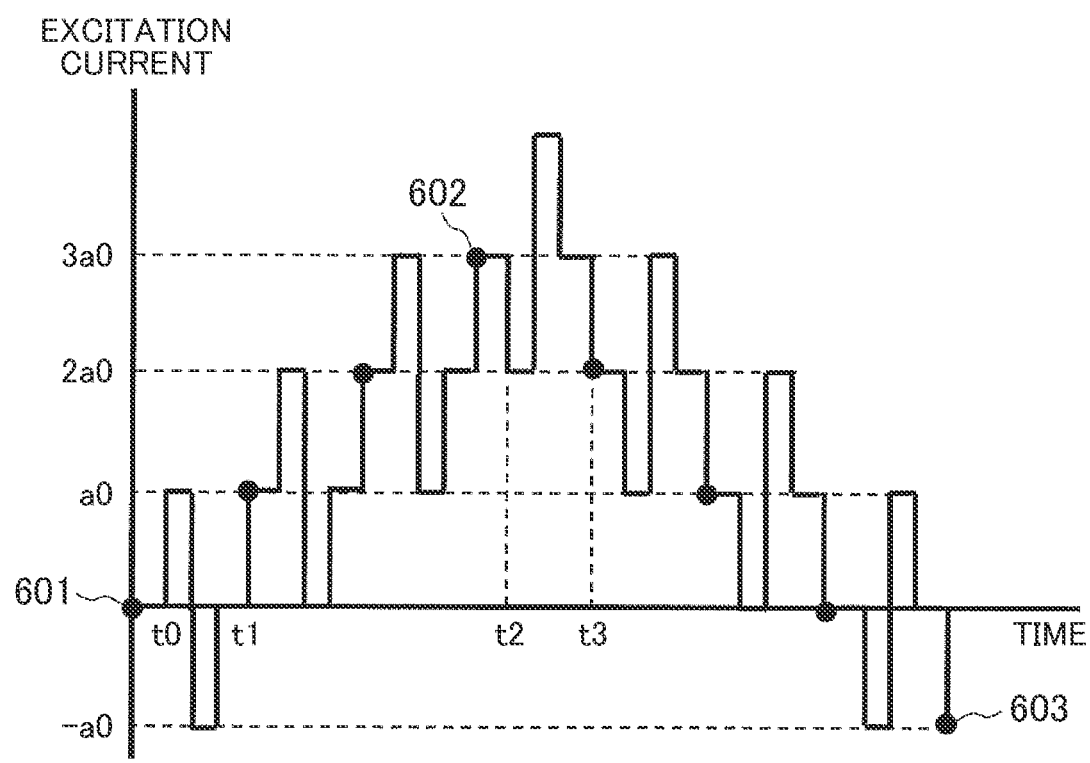
FIG. 6A is an example of a current control method for relaxing the hysteresis of the magnetic field response of the objective lens 112.

FIG. 6A is an example of a current control method for relaxing the hysteresis of the magnetic field response of the objective lens 112. The current control method is not limited to an objective lens, but can be applied to a general magnetic field lens such as a round lens, a deflection lens, and a multipole lens. Examples of these lenses will be described in embodiments to be described later.

First, a current control method for changing the excitation current to a target current by increasing the excitation current in one direction will be described. Here, a direct current amount 3×a0 is assumed to be a first target current. An alternating current having an amplitude a0 is applied to a first excitation current 601 of the objective lens 112 for one cycle (time t0). Next, a direct current having a current amount a1 (=a0) is applied (time t1). When the same procedure is repeated two times, the excitation current of the objective lens 112 reaches a first target current 602. As described above, when the alternating current and the direct current are combined and generated, the reproducibility of the magnetic field response is improved. At this time, if the amplitude a0 of the alternating current is made sufficiently smaller than the target current, the magnetic field response having no output offset can be obtained.

Next, a current control method for inverting the current sign of a direct current will be described. Here, a direct current amount −a0 is assumed to be a second target current. After the first target current 602 is applied, an alternating current whose phase is shifted by 1800 is applied (time t2). Next, a direct current having an amplitude −a1 (=−a0) is applied (time t3). When the same procedure is repeated three times, the excitation current of the objective lens 112 reaches a second target current 603. As described above, in the case where the current path of the direct current is inverted, if the alternating current and the direct current with the phases shifted are combined and generated, the control follows the past current path, and the reproducibility of the magnetic field response is improved. The waveform of the alternating current and the driving timing of the direct current shown in FIG. 6A are examples, and a modified example will be described later.

Figure 6B:
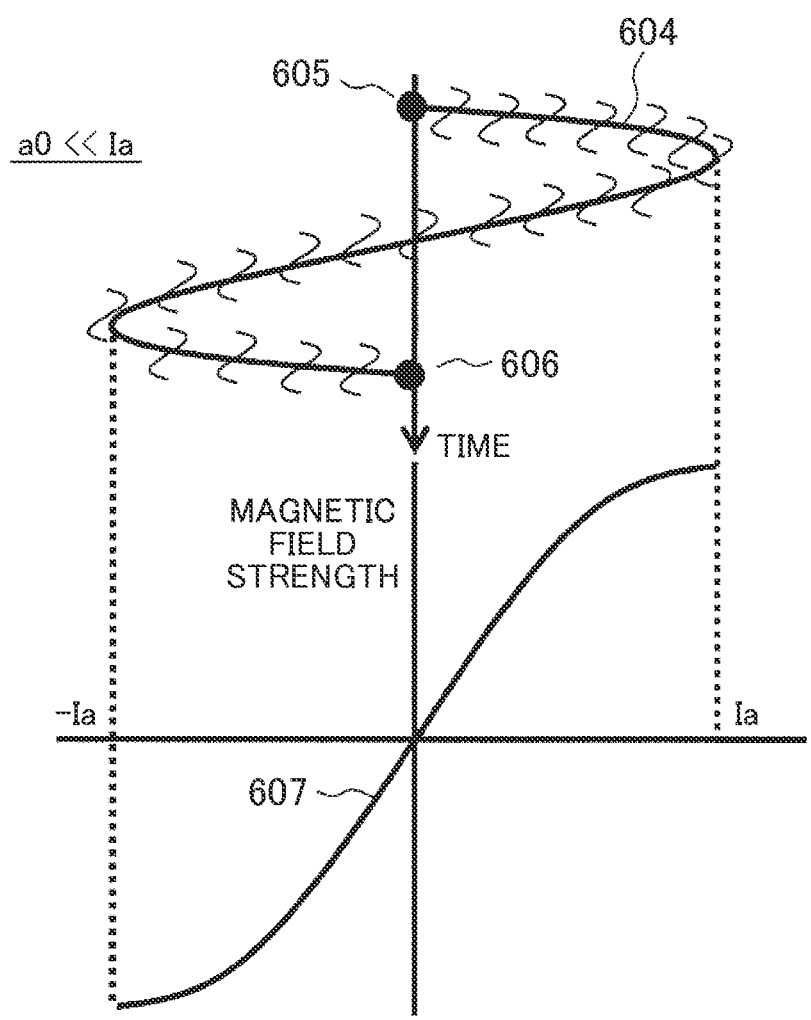
FIG. 6B is an example of the magnetic field response using current control for relaxing the hysteresis of the objective lens 112.

FIG. 6B is an example of the magnetic field response using current control for relaxing the hysteresis of the objective lens 112. The upper part of FIG. 6B schematically shows the excitation current waveform (that is, an alternating current having a small amplitude is combined in a current waveform that fluctuates up and down as a whole) shown in FIG. 6A. The excitation current of the objective lens 112 is applied from a start point 605 of the excitation current to an end point 606 of the excitation current along a current path 604 by using the current control for relaxing the hysteresis. At this time, the output offset caused by the hysteresis is suppressed, and the magnetic field response of the objective lens 112 shows a magnetic field response 607 independent of the excitation path.

Figure 7:
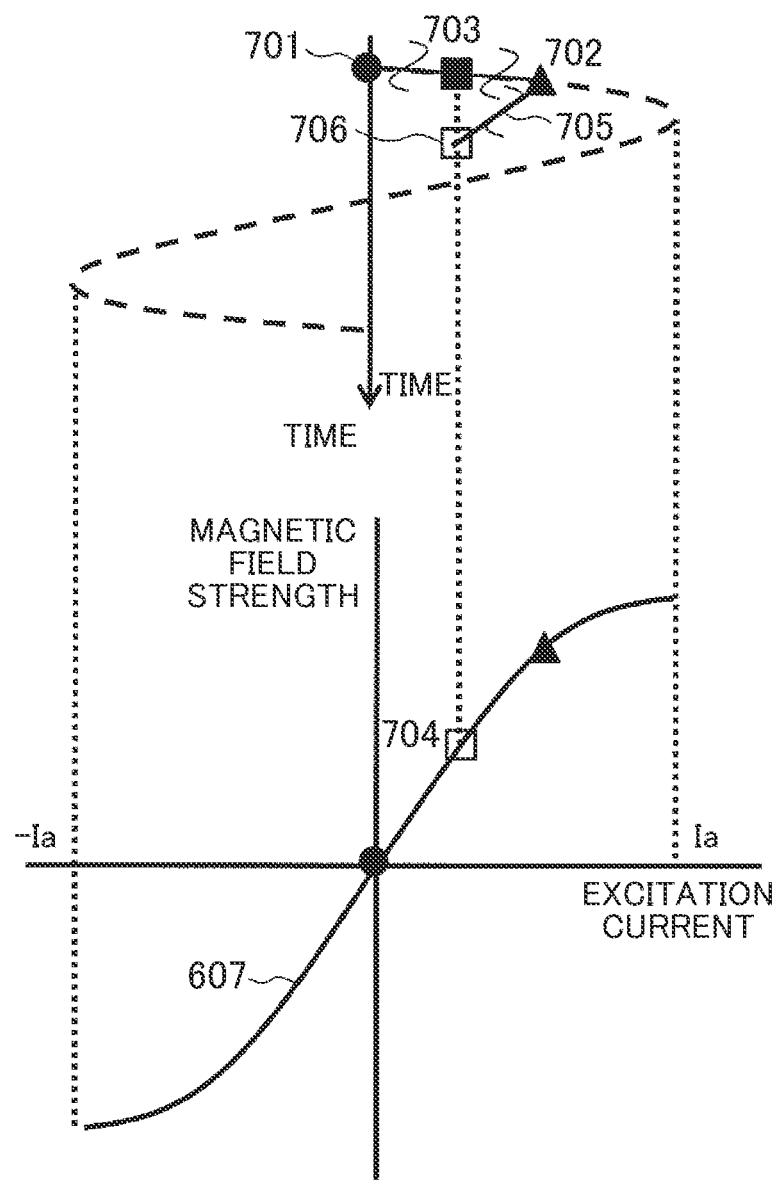
FIG. 7 is an example in which the focus adjustment using the current control for relaxing the hysteresis is applied to the objective lens 112.

FIG. 7 is an example in which the focus adjustment using the current control for relaxing the hysteresis is applied to the objective lens 112. An observation image is photographed while sweeping the excitation current from a start point 701 of a focus adjustment current to an end point 702 of the focus adjustment current by using the current control for relaxing the hysteresis, and a focus evaluation value in each observation image is measured. It is assumed that the magnetic field strength having the highest focus evaluation value is the magnetic field strength 704 of an excitation current 703. In this case, the excitation current is changed to a target current 706 for focus adjustment along a current path 705 shown by a solid line by using the current control for relaxing the hysteresis. Although FIG. 7 illustrates as if the excitation current is linearly varied from the end point 702 toward the target current 706, it is added that the actual excitation current changes according to the current waveform obtained by combining the direct current and the alternating current as shown in FIG. 6A.

As described above, even in the case where a current in the direction opposite to the current path of the direct current is applied, the current control for circulating the current path in a wider area than the target current 706 is unnecessary, and highly-accurate focus adjustment can be realized in a short time.

Figure 8:
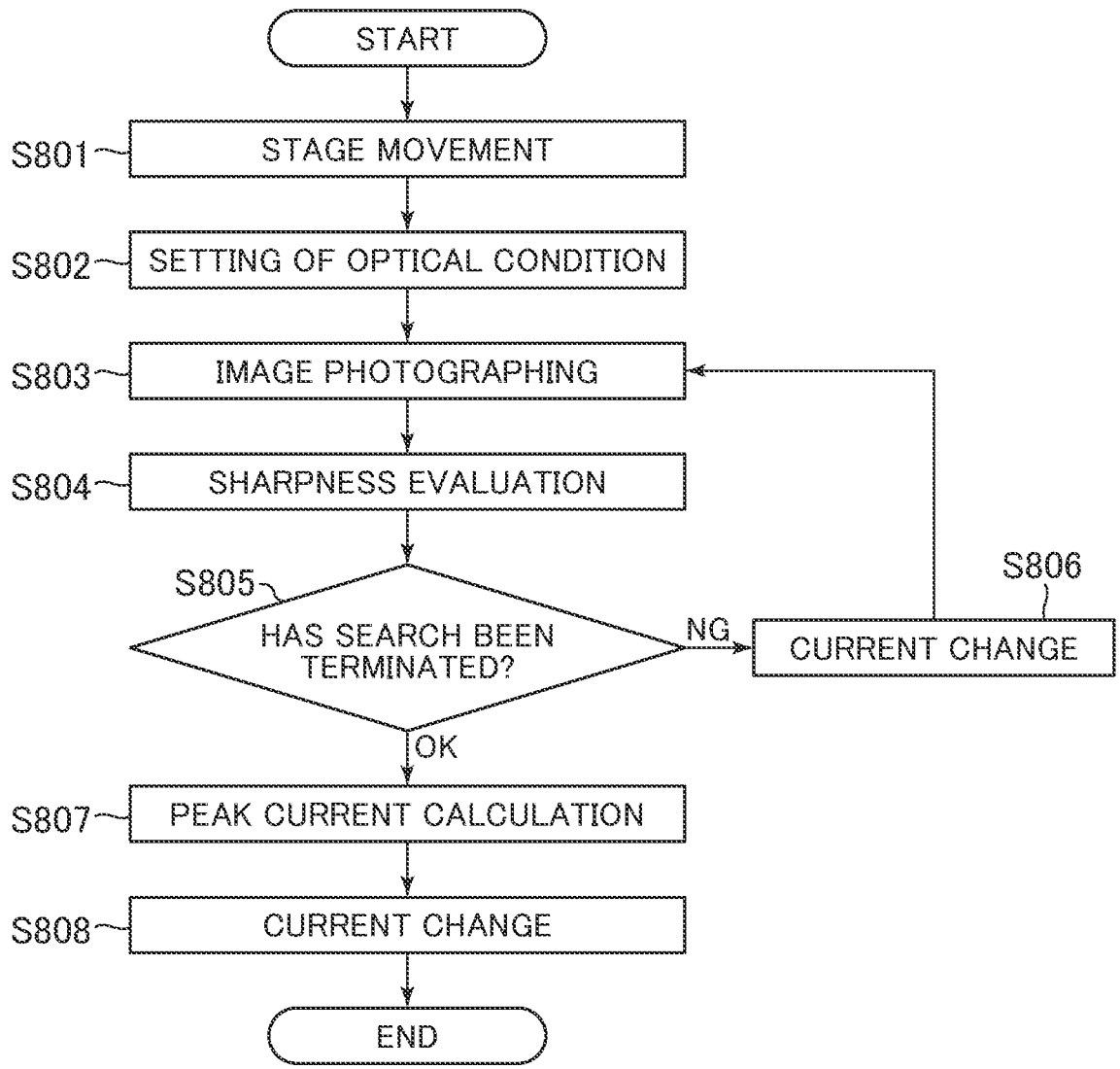
FIG. 8 is a flowchart of focus adjustment by the objective lens 112 executed by a control unit 126.

FIG. 8 is a flowchart of focus adjustment by the objective lens 112 executed by the control unit 126. The timing at which the focus adjustment according to this flow is executed is not particularly limited. The execution timing is not limited to the timing before the start of dimension measurement or defect inspection, but may be, for example, when the optical condition such as an acceleration voltage is changed or when the atmospheric pressure or the air temperature largely changes. The same applies to flowcharts to be described later. This flowchart can be executed by the control unit 126 controlling each unit. The same applies to flowcharts to be described later.

First, the stage control unit 115 moves the stage 113 to the observation position (S801). In the case where a sample for focus adjustment is mounted on the stage 113 as a standard sample, the stage 113 is moved so that the sample for adjustment is in the visual field of the SEM. In S802, optical conditions for acquiring an SEM image are set. The optical conditions include an acceleration voltage controlled by the electron gun control unit 104, a retarding voltage controlled by the retarding voltage control unit 117, the excitation current of the condenser lens controlled by the condenser lens control unit, the excitation current of the objective lens controlled by the objective lens control unit 111, the excitation currents of various deflectors, and the like. In S803, an observation image is photographed. In S804, the focus evaluation value of the photographed SEM image is measured. In S805, it is determined whether the designated number of focus searches has been satisfied, and if the designated number of focus searches has been satisfied, the flow proceeds to S807, and if not, the flow proceeds to S806. In S806, the designated excitation current amount is applied to the objective lens 112 by using the current control for relaxing the hysteresis, and the flow proceeds to S803. In S807, the peak current having the highest focus evaluation value is calculated from the relationship between the excitation current and the focus evaluation value measured up to S805. In S808, the peak current (target current) is applied to the objective lens 112 by using the current control for relaxing the hysteresis, and the focus adjustment is terminated.

By applying the current control for relaxing the hysteresis according to the present invention to the first condenser lens control unit 105, the second condenser lens control unit 108, the objective lens control unit 111, the first deflector control unit 119, the E×B control unit 122, and the astigmatic corrector control unit 129, the reproducibility of the magnetic field response is improved, and highly-accurate electron orbit control can be realized in a short time.

Second Embodiment

In a second embodiment of the present invention, a technique capable of improving the reproducibility of the magnetic field response of the deflection lens and realizing highly-accurate visual field movement in a short time will be described. A scanning electron microscope will be described as an example of a charged particle beam device.

Figure 9:
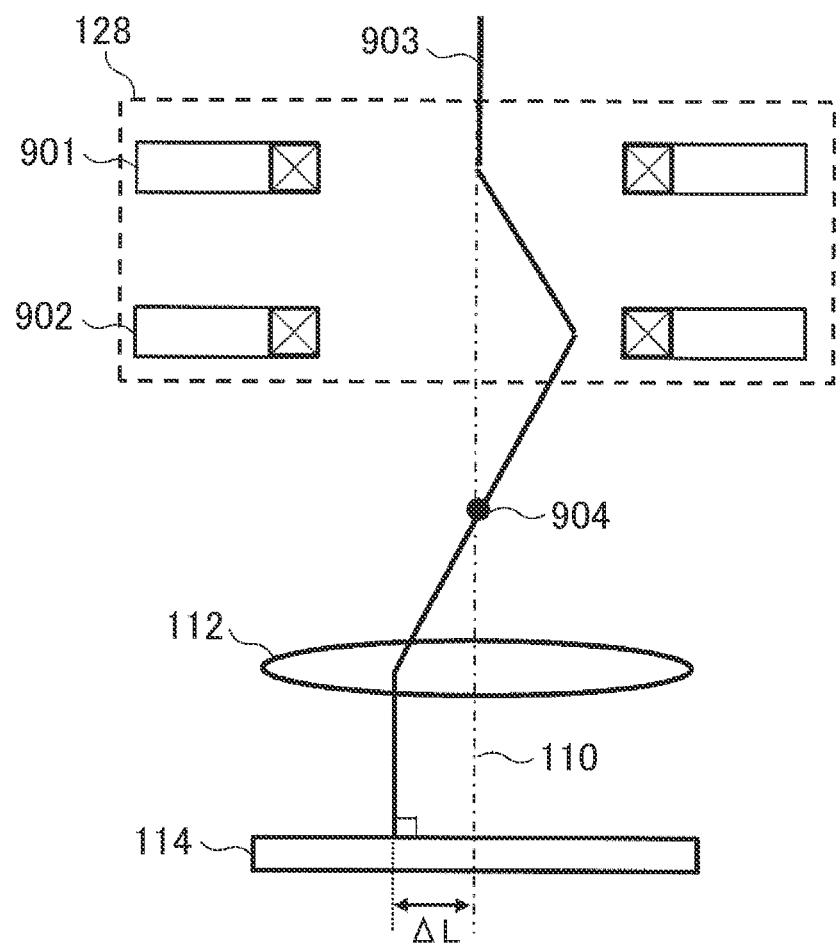
FIG. 9 is an example of visual field movement using an image shift deflector 128.

FIG. 9 is an example of visual field movement using an image shift deflector 128. The image shift deflector 128 is configured using an upper deflector 901 and a lower deflector 902. An electron beam 903 is separated from the optical axis 110 by the deflection field of the upper deflector 901. The separated electron beam 903 is deflected to a focus point 904 in front of the objective lens 112 by the deflection field of the lower deflector 902. The electron beam 903 having passed through the focus position 904 passes through the objective lens 112 and lands perpendicularly to the sample 114 separated from the optical axis 110 by a distance ΔL. As described above, in the visual field movement using the image shift deflector 128, the magnetic field strengths of the upper deflector 901 and the lower deflector 902 are changed, and the incident angle of the electron beam 903 with respect to the focus position 904 in front of the objective lens 112 is adjusted to control the sample arrival position of the electron beam 903.

Figure 10:
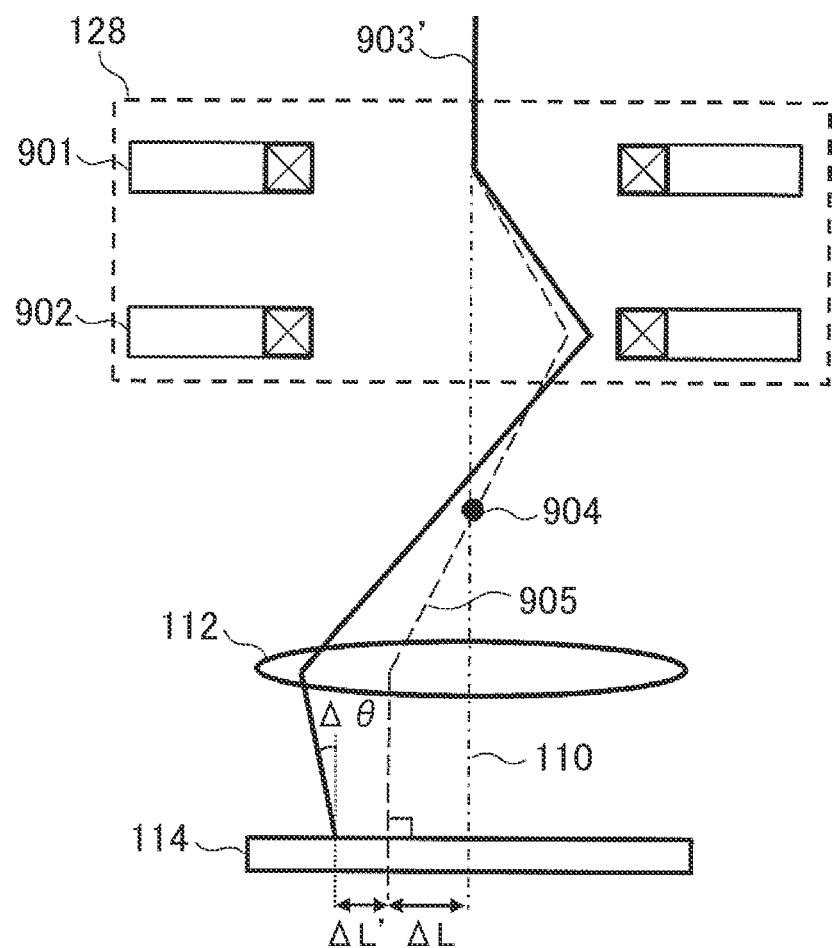
FIG. 10 is an example of a problem of the visual field movement using the image shift deflector 128.

FIG. 10 is an example of a problem of the visual field movement using the image shift deflector 128. Here, a case where the upper deflector 901 and the lower deflector 902 configuring the image shift deflector 128 do not output the desired magnetic field strengths due to the influence of hysteresis will be described as an example. An electron beam 903' is separated from the optical axis 110 by the deflection field of the upper deflector 901. Next, the electron beam 903 is deflected to a position different from the focus point 904 in front of the objective lens 112 by the deflection field of the lower deflector 902. The electron beam 903 deflected to the position different from the focus position 904 in front of the objective lens 112 passes through the objective lens 112 and enters the sample 114 separated from the optical axis 110 by a distance ΔL+ΔL' at an inclination angle Δθ. As described above, in the case where the upper deflector 901 and the lower deflector 902 configuring the image shift deflector 128 do not output the desired magnetic field strengths due to the influence of hysteresis, the visual field cannot be moved to the desired position. In addition, when the electron beam 903 enters the sample at the inclination angle Δθ, an aberration due to the inclination angle is generated and the resolution is disadvantageously deteriorated. In addition, when a current of a theoretical value is applied to the deflector, if the shape of the deflection field is distorted by the influence of the hysteresis, the visual field cannot be moved in accordance with the theory.

Figure 11:
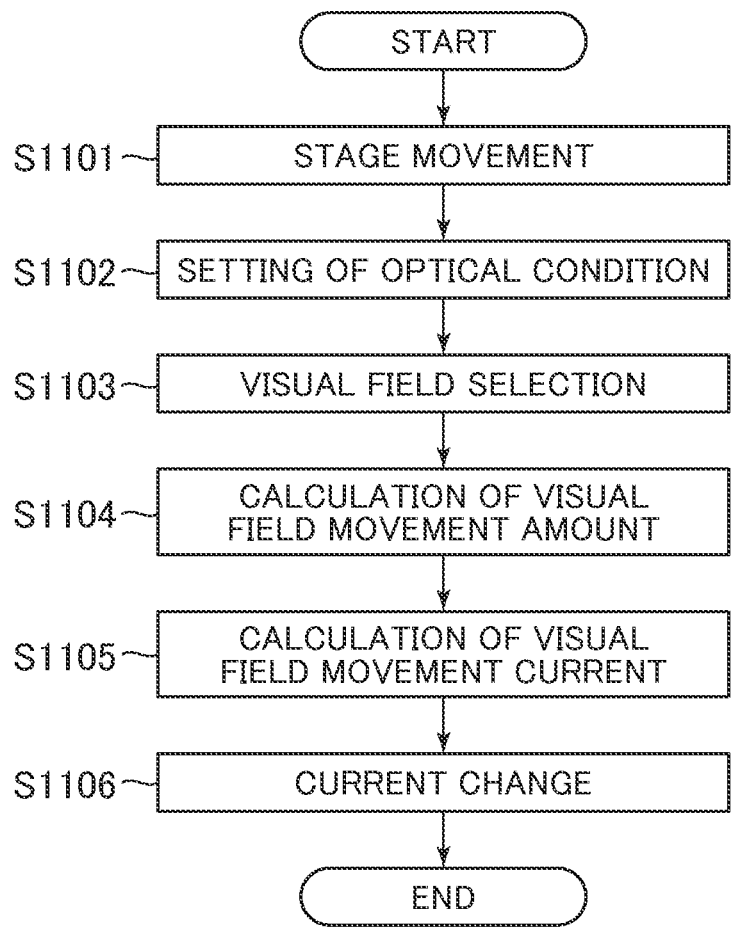
FIG. 11 is a flowchart of the visual field movement by the image shift deflector 128 executed by the control unit 126.

FIG. 11 is a flowchart of the visual field movement by the image shift deflector 128 executed by the control unit 126. First, the stage control unit 115 moves the stage 113 to the observation position (S1101). In S1102, optical conditions for acquiring an SEM image are set. The optical conditions include an acceleration voltage controlled by the electron gun control unit 104, a retarding voltage controlled by the retarding voltage control unit 117, the excitation current of the condenser lens controlled by the condenser lens control unit, the excitation current of the objective lens controlled by the objective lens control unit 111, the excitation currents of various deflectors, and the like. In S1103, a visual field is selected. In the selection of the visual field, the user may designate arbitrary coordinates or preset coordinates. In SI 104, the amount of visual field movement is calculated from the current coordinates and the designated coordinates. In SI 105, the excitation current amount to be applied to the upper deflector 901 and the lower deflector 902 configuring the image shift deflector 128 is calculated from the calculated amount of visual field movement. In S1106, the excitation current (target current) calculated using the current control for relaxing the hysteresis is applied to the upper deflector 901 and the lower deflector 902.

At the time of inspection and measurement of the sample, it is necessary to frequently perform up, down, left, and right visual field movement. By applying the current control for relaxing the hysteresis according to the present invention to the deflection lens, even in the case where a current in the direction opposite to the current path of the direct current is applied, the current control for circulating the current path in a wider area than the target current is unnecessary, and highly-accurate visual field movement can be realized in a short time.

Third Embodiment

In a third embodiment of the present invention, a technique capable of improving the reproducibility of the magnetic field response of the EXB lens and realizing highly-accurate aberration correction in a short time will be described. A scanning electron microscope will be described as an example of a charged particle beam device.

Figure 12:
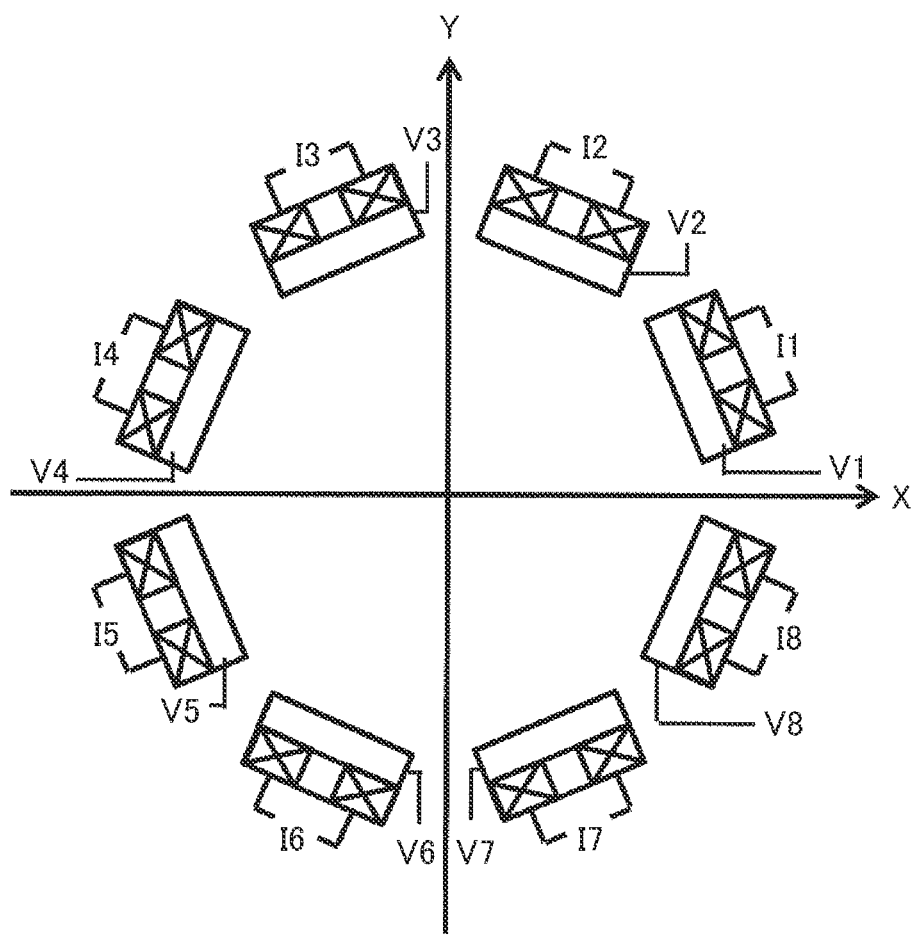
FIG. 12 is an example of an ExB lens 123.

FIG. 12 is an example of the E×B lens 123. The E×B lens 123 is configured using, for example, electric field type deflectors (corresponding to V1 to V8) of 8 poles and magnetic field type deflectors (I1 to I8) of 8 poles. The third embodiment is not limited to 8 poles and is applicable to multipole lenses such as 4 poles, 6 poles, 10 poles, and 12 poles. The E×B lens 123 configured using 8 poles can generate a predetermined multipole field when an electric field or an excitation current of each pole is applied at a predetermined ratio. Examples of the multipole field include, for example, a dipole field, a quadrupole field, a hexapole field, an octupole field, and the like. The E×B lens 123 has a role of deflecting electrons from the optical axis 110 toward the detector 125 by using a dipole field, and a role of correcting the aberration (astigmatism, chromatic aberration, deflection distortion, and the like) generated when the electrons are deflected from the optical axis 110. A method of outputting a multipole field and a method of correcting an aberration are described in Patent Literature 2.

Figure 13:
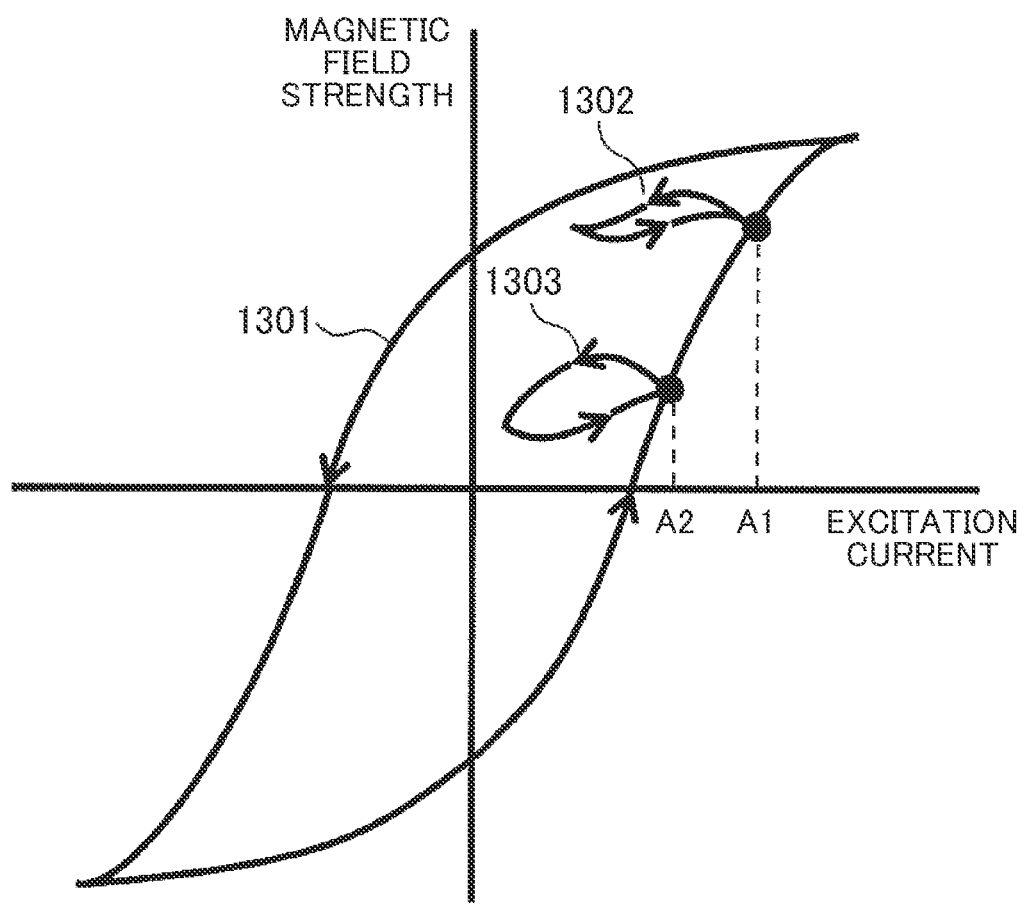
FIG. 13 is an example of a problem of the ExB lens 123 configured using 8 poles.

FIG. 13 is an example of a problem of the E×B lens 123 configured using 8 poles. Here, a case in which astigmatism generated when electrons are deflected from the optical axis 110 is corrected by superimposing a magnetic field type quadrupole field on the E×B lens 123 to which a magnetic field type dipole field is applied will be described as an example. Each pole of the E×B lens 123 is assumed to show a magnetic field response 1301. When a magnetic field type dipole field is applied to the E×B lens 123, the excitation current amount differs for each pole. For example, the excitation current of a pole 11 is an excitation current A1, and the excitation current of a pole 12 is an excitation current A2. When a magnetic field type quadrupole field is increased or decreased in order to correct the astigmatism from this state, the magnetic field response differs for each pole. For example, the pole 11 shows a magnetic field response 1302 and the pole 12 shows a magnetic field response 1303. The reason why the magnetic field response differs for each pole is that the magnetic permeability of the magnetic body changes according to the excitation current amount. Although FIG. 13 shows the magnetic field responses of the pole 11 and the pole 12, the other poles also show different magnetic field responses as similar to the magnetic field responses 1302 and 1303. In addition, although the magnetic field type quadrupole field has been described here as an example, the same problem arises for the other multipole fields. The other multipole fields include a dipole field, a quadrupole field, a hexapole field, an octupole field, a dodecapole field, and the like, each having components (X direction and Y direction) in two directions.

As described above, when a predetermined multipole field is generated by an excitation current in accordance with theory by using the poles having different magnetic field responses, a desired multipole field shape is not obtained. If a desired multipole field shape is not obtained, the correction according to theory cannot be accurately performed. For example, new problems arise so that the resolution is deteriorated due to generation of a parasitic aberration such as a coma aberration and the optical axis is deviated due to generation of a parasitic dipole field. In addition, in the case where the magnetic field response of each pole is unstable, a parasitic aberration caused by deviation from the ideal shape is nonlinearly generated. When a parasitic aberration is nonlinearly generated, the parasitic aberration cannot be feedforward-controlled, and the control disadvantageously takes time.

Figure 14:
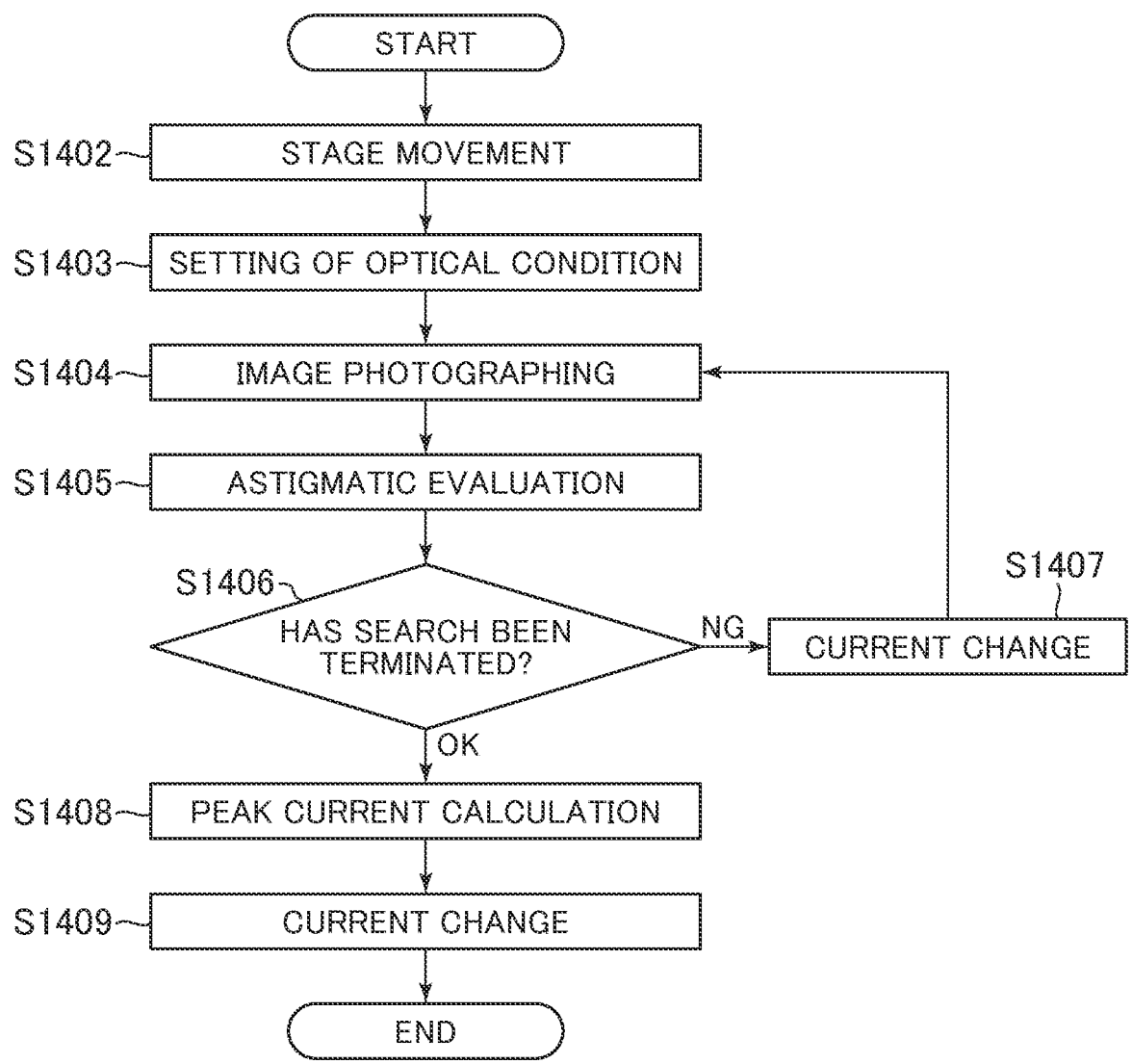
FIG. 14 is a flowchart of astigmatic adjustment using the ExB lens 123.

FIG. 14 is a flowchart of astigmatic adjustment using the ExB lens 123. First, the stage control unit 115 moves the stage 113 to the observation position (S1402). In the case where a sample for astigmatic adjustment is mounted on the stage 113 as a standard sample, the stage 113 is moved so that the sample for adjustment is in the visual field of the SEM. In S1403, optical conditions for acquiring an SEM image are set. The optical conditions include an acceleration voltage controlled by the electron gun control unit 104, a retarding voltage controlled by the retarding voltage control unit 117, the excitation current of the condenser lens controlled by the condenser lens control unit, the excitation current of the objective lens controlled by the objective lens control unit 111, the excitation currents of various deflectors, and the like. In S404, an observation image is photographed. In S1405, the astigmatic evaluation value of the photographed SEM image is measured. The astigmatic evaluation value is a numerical value obtained by calculating the sharpness of each orientation of the SEM image and using the difference, ratio, or the like of the sharpness. In S1406, it is determined whether the designated number of astigmatic searches has been satisfied, and if the designated number of astigmatic searches has been satisfied, the flow proceeds to S1408, and if not, the flow proceeds to S1407. In S1407, the designated excitation current amount is applied to the ExB lens 123 by using the current control for relaxing the hysteresis, and the flow proceeds to S1404. In S1408, the peak current having the highest astigmatic evaluation value is calculated from the relationship between the excitation current and the astigmatic evaluation value measured up to S1406. In S1409, the peak current (target current) is applied to the ExB lens 123 by using the current control for relaxing the hysteresis, and the astigmatic adjustment is terminated.

By applying the current control for relaxing the hysteresis according to the present invention to the multipole lens, even in the case where a current in the direction opposite to the current path of the direct current is applied, the current control for circulating the current path in a wider area than the target current is unnecessary, and highly-accurate aberration correction can be realized in a short time.

Fourth Embodiment

In a fourth embodiment of the present invention, a technique capable of improving the reproducibility of the magnetic field response of a magnetically-coupled lens group and realizing highly-accurate electron orbit control will be described. A scanning electron microscope will be described as an example of a charged particle beam device.

Figure 15:
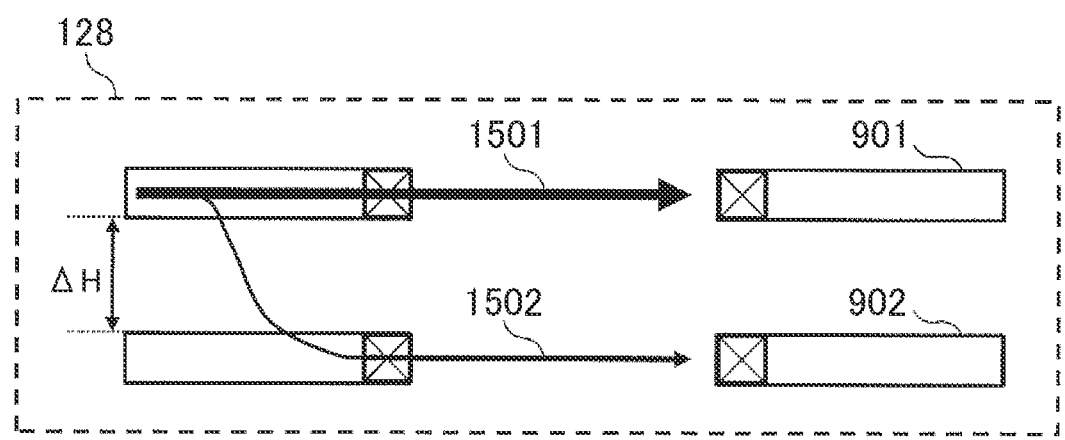
FIG. 15 is an example in which an upper deflector 901 and a lower deflector 902 configuring the image shift deflector 128 are magnetically coupled.

FIG. 15 is an example in which the upper deflector 901 and the lower deflector 902 configuring the image shift deflector 128 are magnetically coupled. In the case where a distance ΔH between the upper deflector 901 and the lower deflector 902 of the image shift deflector 128 is close, when a deflection field 1501 is generated by the upper deflector 901, a deflection field 1502 is generated by the magnetic field leakage to the lower deflector 901. This magnetic field leakage is not limited to the image shift deflector 128, and also occurs in other lenses when the distance between the lenses divided in the plane, the distance between the other lenses, the distance between magnetized components such as magnetic shields, or the like is close.

Figure 16:
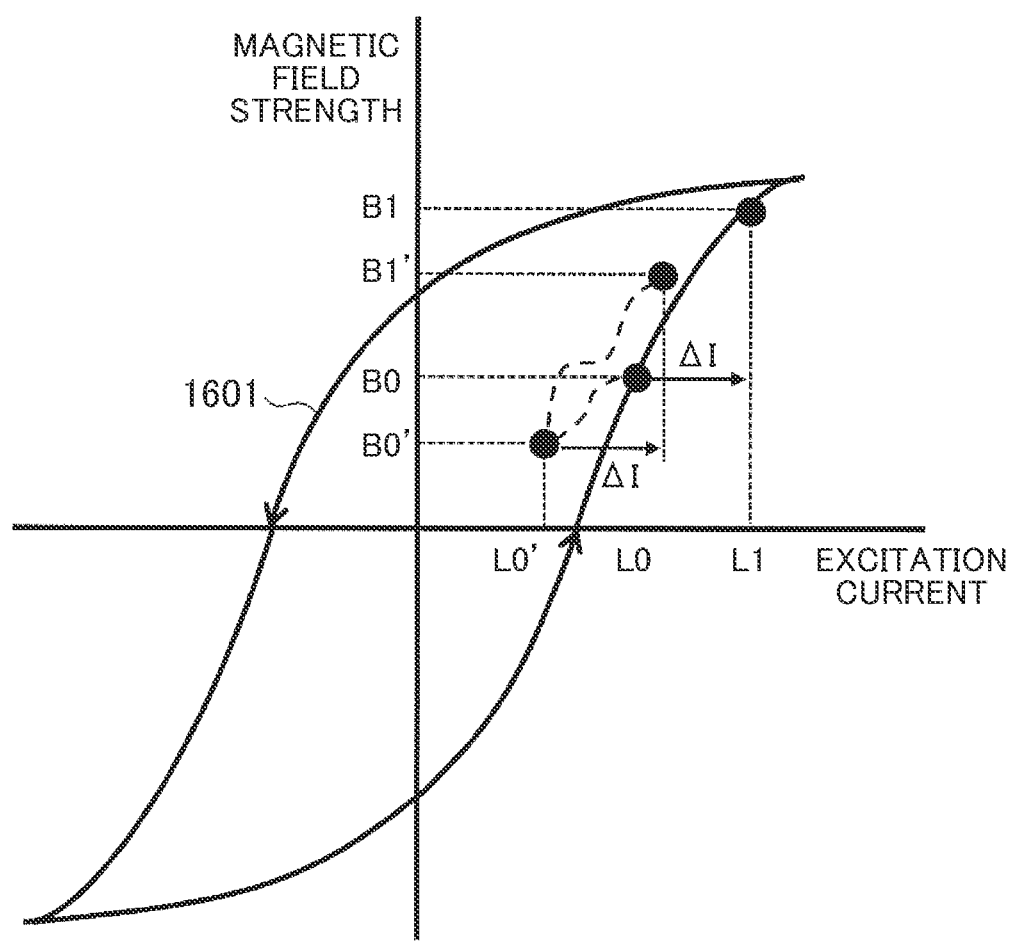
FIG. 16 is an example of a problem in the magnetic field response in the image shift deflector 128.

FIG. 16 is an example of a problem in the magnetic field response in the image shift deflector 128. Here, the magnetic field response of the lower deflector 902 in the case where the magnetic field leaks from the upper deflector 901 will be described.

The lower deflector 902 shows a magnetic field response 1601 to a clockwise excitation path. The deflector 902 outputs a magnetic field strength B0 at an excitation current L0, and outputs a magnetic field strength B1 at L1 obtained by increasing the excitation current L0 by ΔI. When the lower deflector 902 outputs the magnetic field strength B0 at the excitation current L0 and the magnetic field in the direction opposite to the excitation path is received due to the magnetic field leakage from the upper deflector 901, the magnetic field strength of the lower deflector 902 follows an unstable path shown by a broken line and reaches a magnetic field strength B0' (mock excitation current L0'). At this time, when the excitation current of the lower deflector 902 is increased by ΔI, the magnetic field strength of the lower deflector 902 follows an unstable path shown by a broken line and reaches a magnetic field strength B1'. As described above, in the magnetically-coupled lens group, when the magnetic field in the direction opposite to the excitation path memorized by the magnetic field leakage is received, a problem that the memorized magnetic field response is lost newly arises. In addition, there is also a problem that if distortion occurs in the shape of the output field due to the magnetic field leakage, a desired correction function becomes incomplete, and correction according to theory cannot be performed.

Figure 17:
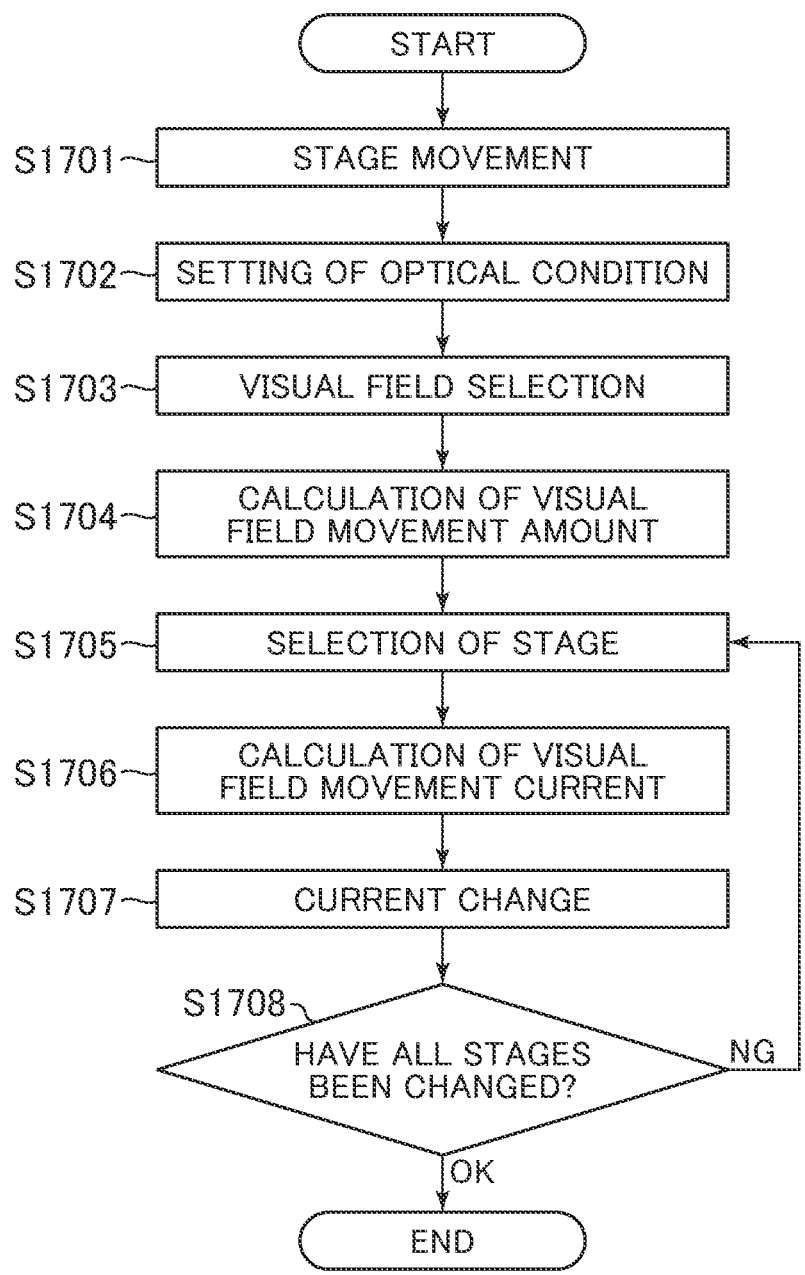
FIG. 17 is a flowchart of visual field movement using the image shift deflector 128.

FIG. 17 is a flowchart of visual field movement using the image shift deflector 128. An example of a magnetic field adjustment flow in the magnetically-coupled lens group will be described with reference to FIG. 17. First, the stage control unit 115 moves the stage 113 to the observation position (S1701). In S1702, optical conditions for acquiring an SEM image are set. The optical conditions include an acceleration voltage controlled by the electron gun control unit 104, a retarding voltage controlled by the retarding voltage control unit 117, the excitation current of the condenser lens controlled by the condenser lens control unit, the excitation current of the objective lens controlled by the objective lens control unit 111, the excitation currents of various deflectors, and the like. In S1703, a visual field is selected. The user may designate arbitrary coordinates or preset coordinates in the selection of the visual field. In S1704, the amount of visual field movement is calculated from the current coordinates and the designated coordinates. In S1705, a stage for changing the excitation current is selected. In S1706, the excitation current amount of the designated stage is calculated on the basis of the calculated amount of visual field movement. In S1707, a designated excitation current (target current) is applied to a designated stage by using the current control for relaxing the hysteresis. In S1708, if the excitation currents of all the stages are not changed, the flow proceeds to S1705, and if the excitation currents of all the stages are changed, the visual field movement is terminated.

In FIG. 17, the excitation current is changed for each lens stage, but may be simultaneously changed for all the lens stages to shorten the adjustment time. It is preferable that the amplitude a0 of the alternating current used for the current control for relaxing the hysteresis is set so that the magnetic field response of a predetermined lens does not change even when the alternating current having the amplitude a0 is applied to the lens closest to the predetermined lens in the magnetically-coupled lens group.

By applying the current control for relaxing the hysteresis according to the present invention to the magnetically-coupled lens group, a change in the magnetic field response of the adjacent lens due to the magnetic field leakage is suppressed, and highly-accurate electron orbit control can be realized in a short time.

Fifth Embodiment

In a fifth embodiment of the present invention, a modified example of the current control for relaxing the hysteresis of the magnetic field lens will be described.

Figure 18A:
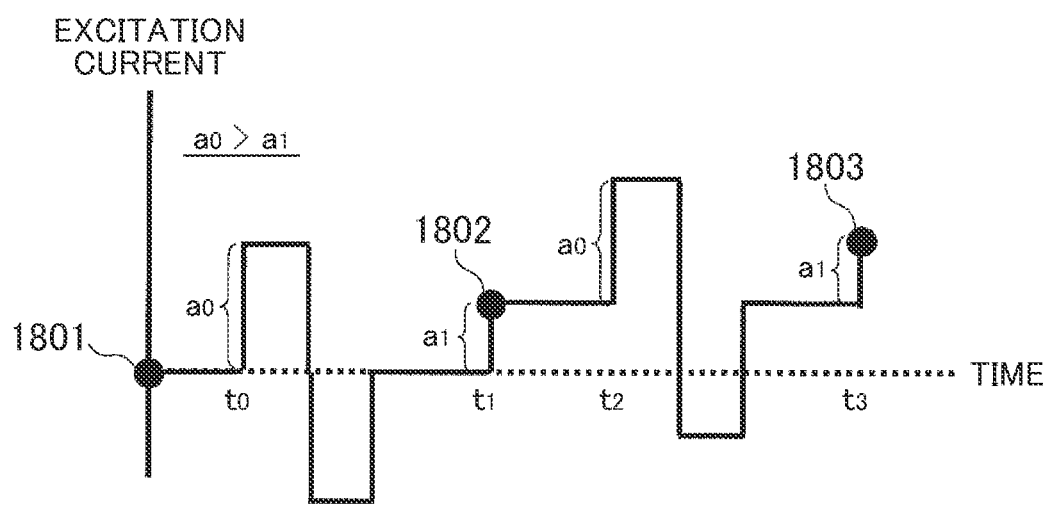
FIG. 18A shows a first example of hysteresis relaxation current control.

FIG. 18A shows a first example of hysteresis relaxation current control. An alternating current having an amplitude a0 is applied to a magnetic field lens having a predetermined initial current 1801 at time t0. Then, a direct current having an amplitude a1 (<a0) is applied by driving at time t1 (excitation current 1802). Then, an alternating current having an amplitude a0 is applied at time 2. Then, a direct current having an amplitude a1 (<a0) is applied by driving at time t3 (excitation current 1803). As described above, when the alternating current and the direct current, which are mutually and periodically divided, are combined to generate the excitation current and current control for circulating in a predetermined range is applied, the reproducibility of the magnetic field response is improved. At this time, it is preferable that the alternating current is generated for at least one cycle or more within one cycle of the direct current.

Figure 18B:
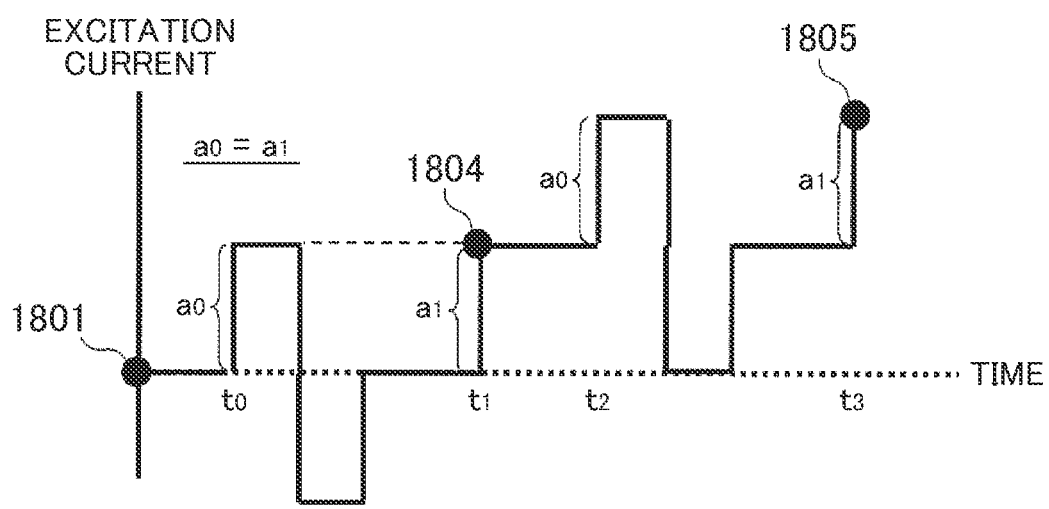
FIG. 18B shows a second example of the hysteresis relaxation current control.

FIG. 18B shows a second example of the hysteresis relaxation current control. An alternating current having an amplitude a0 is applied to a magnetic field lens having a predetermined initial current 1801 at time t0. Then, a direct current having an amplitude a1 (=a0) is applied by driving at time t1 (excitation current 1804). Then, an alternating current having an amplitude a0 is applied at time t2. Then, a direct current having an amplitude a1 (=a0) is applied by driving at time 3 (excitation current 1805). As described above, if the amplitudes of the alternating current and the direct current are made equal (a1=a0), the current change in a wider area can be realized in a shorter time than that in the first example. However, in the case where the amplitude of the direct current is set to be larger than the amplitude of the alternating current (a1>a0), the control follows a path that is not memorized, so that the reproducibility of the magnetic field response becomes low.

Figure 18C:
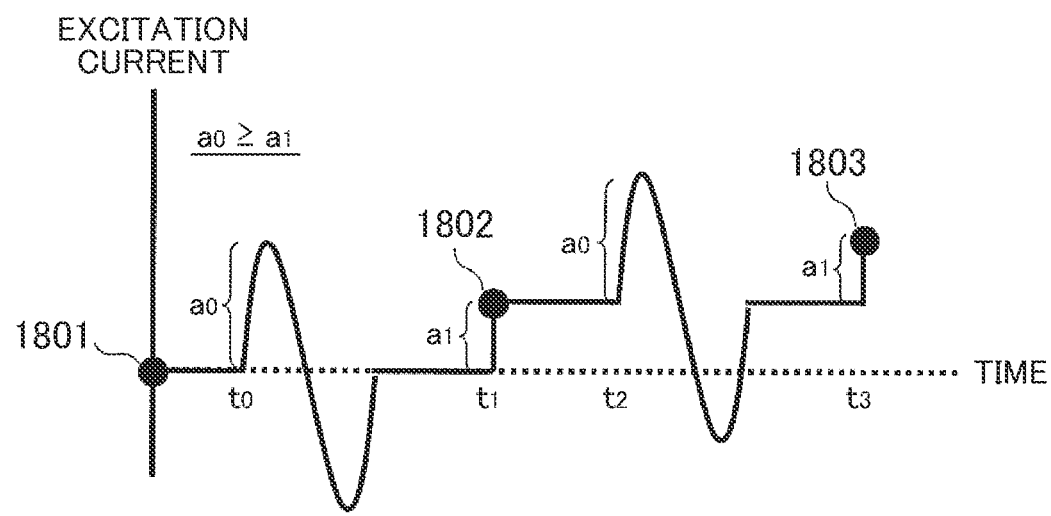
FIG. 18C shows a third example of the hysteresis relaxation current control.

FIG. 18C shows a third example of the hysteresis relaxation current control. In the example, the waveform of the alternating current in the first example is changed to a sine wave. When the waveform of the alternating current is changed to a sine wave, the rise time and fall time of the excitation current become slower than that of a rectangular wave, and power supply fluctuation such as overshoot and ringing can be suppressed. Accordingly, the magnetic field response following the power supply fluctuation is suppressed, and the reproducibility of the magnetic field response is improved as compared with the first example. The shape of the alternating current is not limited to a sine wave, but may be a trapezoidal wave, a triangular wave, or the like if the rise time and the fall time of the excitation current are delayed.

Figure 18D:
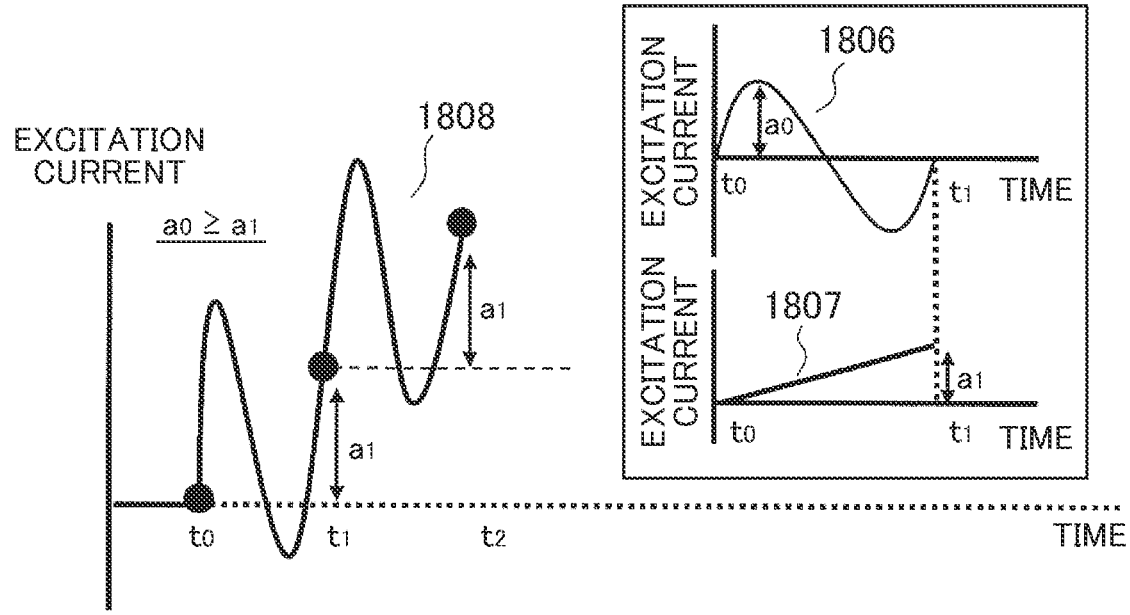
FIG. 18D shows a fourth example of the hysteresis relaxation current control.

FIG. 18D shows a fourth example of the hysteresis relaxation current control. In the example, an alternating current 1806 and a direct current 1807 are continuously driven (1808). In the example, each current is controlled so as to satisfy |a0?≥|a1| when the amplitude of the alternating current is a0, the cycle is t1, and the amount of change of the direct current during the cycle t1 is a1. Accordingly, the current change in a wider area can be realized in a shorter time than that in the first example.

Next, with reference to FIG. 19A to FIG. 19G, a current waveform for each timing at which the direct current is driven in the waveform of the alternating current will be described. Hereinafter, the amplitudes of the alternating current and the direct current will be described as |a0|=|a1|.

Figure 19A:
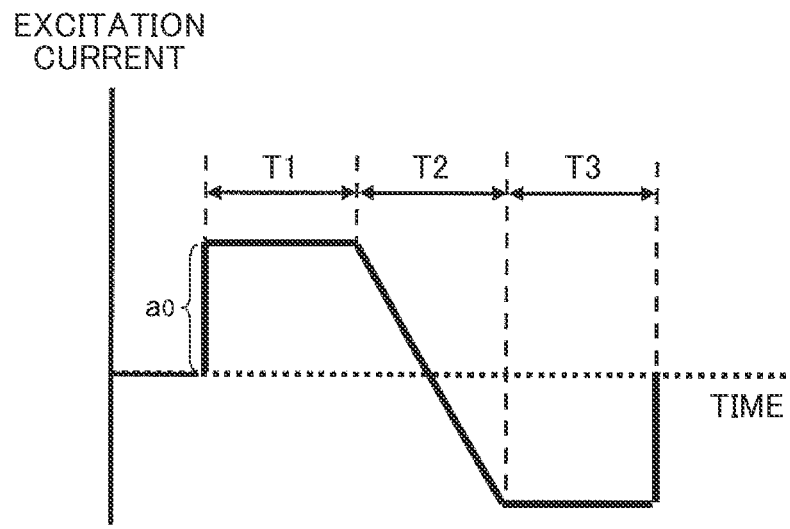
FIG. 19A is an example of three timings for driving a direct current in the waveform of an alternating current.

FIG. 19A is an example of three timings for driving the direct current in the waveform of the alternating current. In the waveform of the alternating current shown in FIG. 19A, there are a first rise period T1, a first fall period T2, and a second rise period T3. In any of these three periods, the direct current can be combined to the alternating current. Examples of the combined current at each timing will be described below.

Figure 19B:
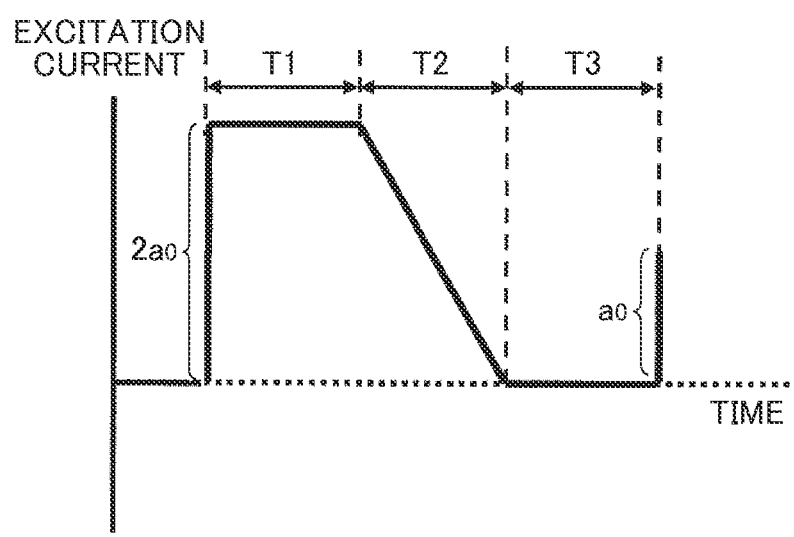
FIG. 19B shows a current waveform in the case where a direct current is driven in a first rise period T1.
Figure 19C:
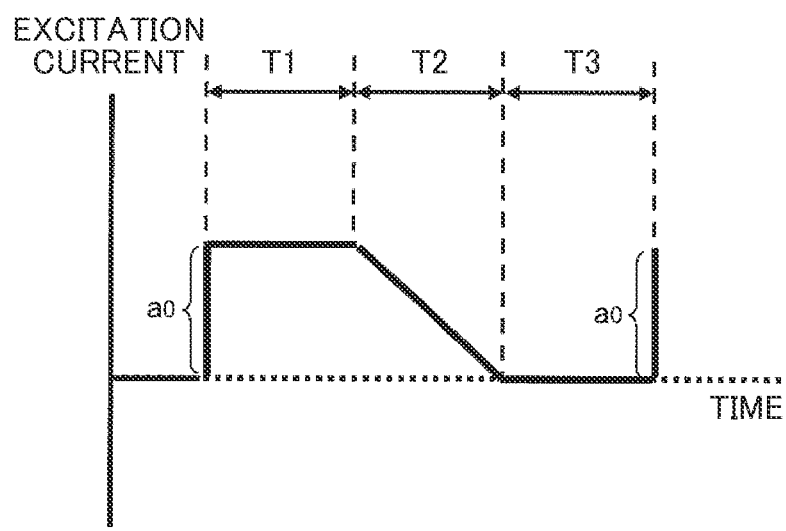
FIG. 19C shows a current waveform in the case where the direct current is driven in a first fall period T2.
Figure 19D:
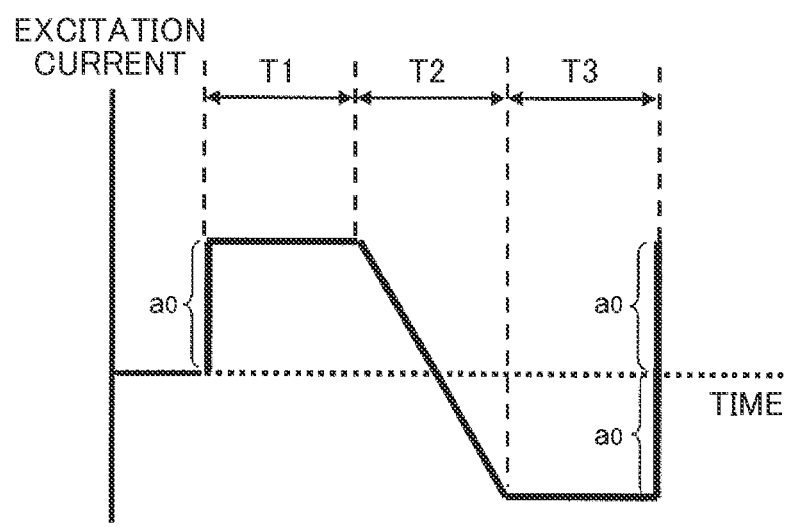
FIG. 19D shows a current waveform in the case where the direct current is driven in a second rise period T3.

FIG. 19B to FIG. 19D are examples of current waveforms in the case where the initial amplitude of the alternating current and the amplitude of the direct current have the same sign.

FIG. 19B shows a current waveform in the case where the direct current is driven in the first rise period T1. In the first rise period T1, the excitation current increases by 2×a0. Then, in the first fall period T2, the excitation current decreases by 2×a0. Then, in the second rise period T3, the excitation current increases by a0.

FIG. 19C shows a current waveform in the case where the direct current is driven in the first fall period T2. In the first rise period T1, the excitation current increases by a0. Then, in the first fall period T2, the excitation current decreases by a0. Then, in the second rise period T3, the excitation current increases by a0.

FIG. 19D shows a current waveform in the case where the direct current is driven in the second rise period T3. In the first rise period T1, the excitation current increases by a0. Then, in the first fall period T2, the excitation current decreases by 2×a0. Then, in the second rise period T3, the excitation current increases by 2×a0.

Figure 19E:
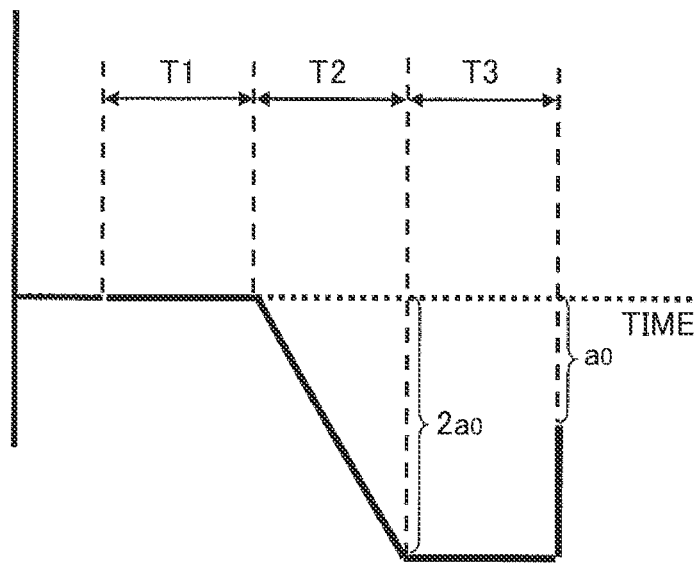
FIG. 19E shows a current waveform in the case where the direct current is driven in the first rise period T1.
Figure 19F:
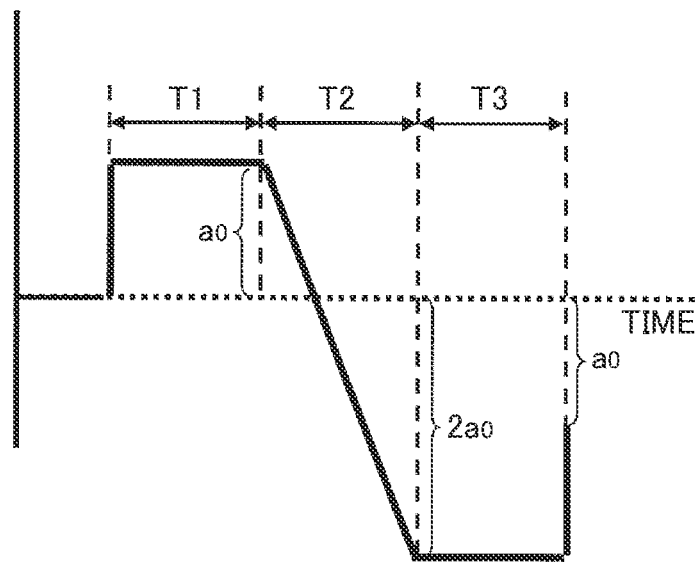
FIG. 19F shows a current waveform in the case where the direct current is driven in the first fall period T2.
Figure 19G:
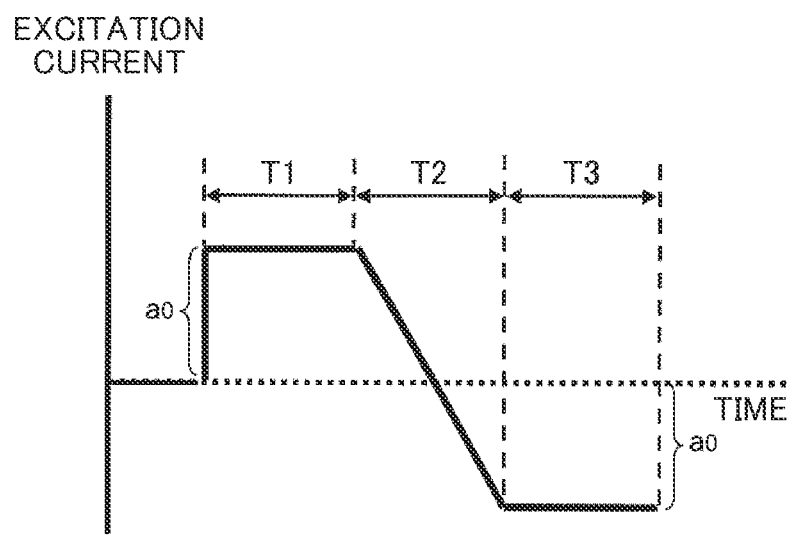
FIG. 19G shows a current waveform in the case where the direct current is driven in the second rise period T3.

FIG. 19E to FIG. 19G are examples of current waveforms in the case where the initial amplitude of the alternating current and the amplitude of the direct current have different signs.

FIG. 19E shows a current waveform in the case where the direct current is driven in the first rise period T1. In the first rise period T1, the alternating current and the direct current cancel each other and the excitation current does not change. Then, in the first fall period T2, the excitation current decreases by 2×a0. Then, in the second rise period T3, the excitation current increases by a0.

FIG. 19F shows a current waveform in the case where the direct current is driven in the first fall period T2. In the first rise period T1, the excitation current increases by a0. Then, in the first fall period T2, the excitation current decreases by 3×a0. Then, in the second rise period T3, the excitation current increases by a0.

FIG. 19G shows a current waveform in the case where the direct current is driven in the second rise period T3. In the first rise period T1, the excitation current increases by a0. Then, in the first fall period T2, the excitation current decreases by 2×a0. Then, in the second rise period T3, the alternating current and the direct current cancel each other and the excitation current does not change.

Next, with reference to FIG. 20A to FIG. 20B, the magnetic field response by the current control shown in FIG. 19B to FIG. 19G will be described.

Figure 20A:
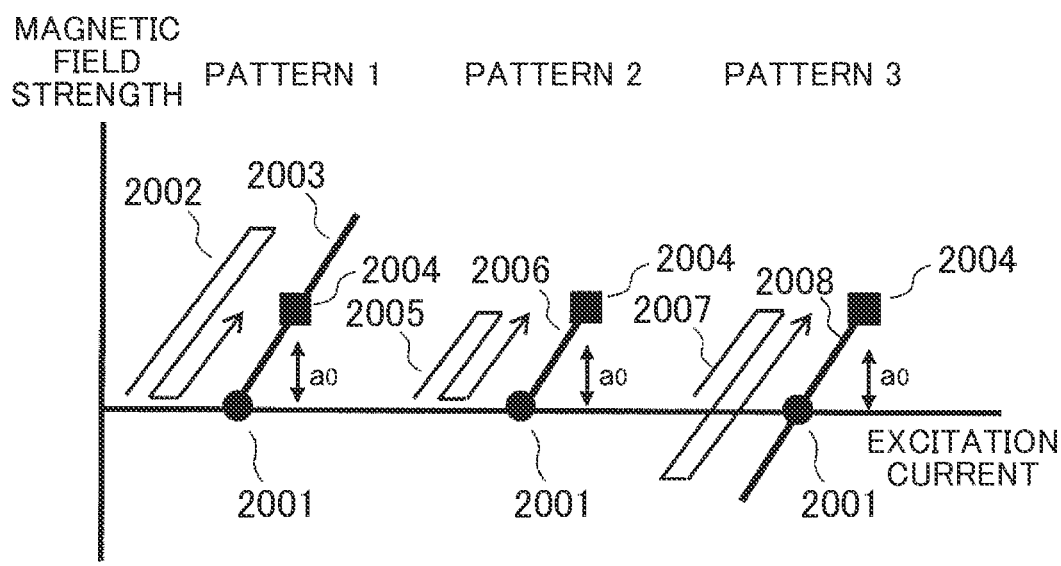
FIG. 20A is a diagram for explaining the magnetic field response by the current control shown in FIG. 19B to FIG. 19G.

A pattern 1 in FIG. 20A is a magnetic field response in the case where the direct current is driven in the first rise period T1 shown in FIG. 19B. When a current path 2002 in which the direct current is driven in the first rise period T1 is applied, the current circulates an excitation path 2003 from the magnetic field strength 2001 of a predetermined initial current to reach a magnetic field strength 2004.

A pattern 2 in FIG. 20A is a magnetic field response in the case where the direct current is driven in the first fall period T2 shown in FIG. 19C. When a current path 2005 in which the direct current is driven in the first fall period T2 is applied, the current circulates an excitation path 2006 from the magnetic field strength 2001 of a predetermined initial current to reach the magnetic field strength 2004.

A pattern 3 in FIG. 20A is a magnetic field response in the case where the direct current is driven in the second rise period T3 shown in FIG. 19D. When a current path 2007 in which the direct current is driven in the second rise period T3 is applied, the current circulates an excitation path 2008 from the magnetic field strength 2001 of a predetermined initial current to reach the magnetic field strength 2004.

As shown in the above-described patterns 1 to 3, when the initial amplitude of the alternating current and the amplitude of the direct current are made to have the same sign and the current is controlled to circulate the current path, a highly-reproducible magnetic field response can be obtained.

Figure 20B:
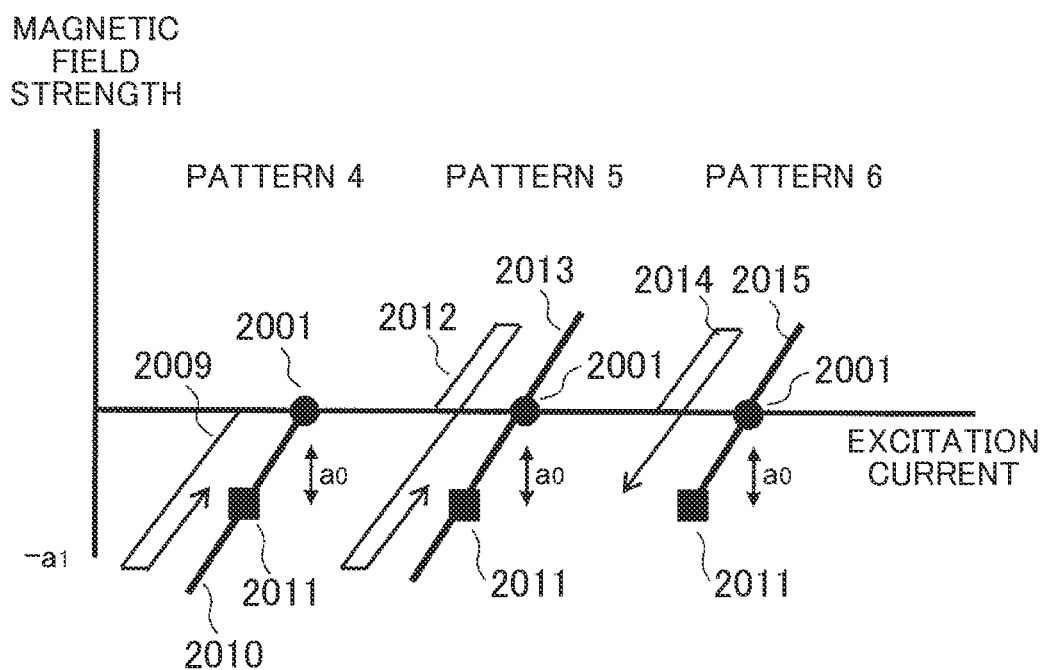
FIG. 20B is a diagram for explaining the magnetic field response by the current control shown in FIG. 19B to FIG. 19G.

A pattern 4 in FIG. 20B is a magnetic field response in the case where the direct current is driven in the first rise period T1 shown in FIG. 19E. When a current path 2009 in which the direct current is driven in the first rise period T1 is applied, the current follows an excitation path 2010 from the magnetic field strength 2001 of a predetermined initial current to reach a magnetic field strength 2011.

A pattern 5 in FIG. 20B is a magnetic field response in the case where the direct current is driven in the first fall period T2 shown in FIG. 19F. When a current path 2012 in which the direct current is driven in the first fall period T2 is applied, the current follows an excitation path 2013 from the magnetic field strength 2001 of a predetermined initial current to reach the magnetic field strength 2011.

A pattern 6 in FIG. 20B is a magnetic field response in the case where the direct current is driven in the second rise period T3 shown in FIG. 19G. When a current path 2014 in which the direct current is driven in the second rise period T3 is applied, the current follows an excitation path 2015 from the magnetic field strength 2001 of a predetermined initial current to reach the magnetic field strength 2011.

As shown in the above-described patterns 4 to 6, in the case where the initial amplitude of the alternating current and the amplitude of the direct current have different signs, the current is controlled to circulate a part of the current path.

Figure 21:
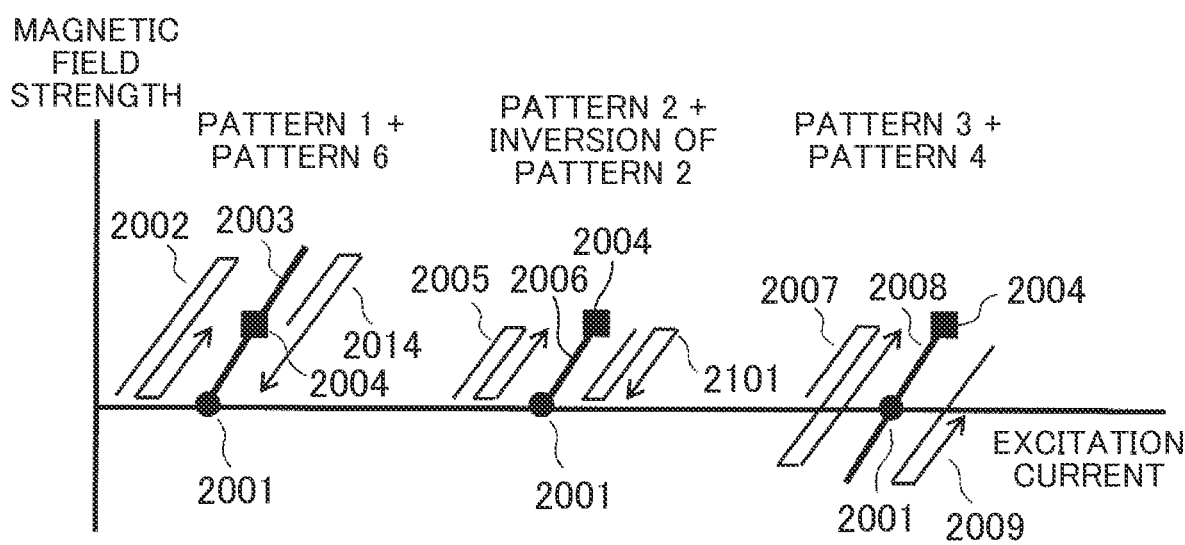
FIG. 21 is an example of current control in the case where the current sign of the direct current is inverted.

FIG. 21 is an example of current control in the case where the current sign of the direct current is inverted. Here, 3 of the patterns described in FIG. 20A to FIG. 20B are picked up and described.

A combination of the pattern 1 and the pattern 6 will be described. First, the excitation current is applied in the current path 2002 of the pattern 1. At this time, the magnetic field strength 2001 of a predetermined initial current circulates the excitation path 2003 to reach the magnetic field strength 2004. Next, in the case where the current sign of the direct current is inverted to return from the magnetic field strength 2004 to the magnetic field strength 2001, the excitation current is applied in the current path 2014 of the pattern 6. At this time, the magnetic field strength 2004 follows the path memorized in the current path 2002 to reach the magnetic field strength 2001.

A combination of the pattern 2 and a pattern obtained by inverting the phase of the pattern 2 will be described. First, the excitation current is applied in the current path 2005 of the pattern 2. At this time, the magnetic field strength 2001 of a predetermined initial current circulates the excitation path 2006 to reach the magnetic field strength 2004. Next, in the case where the current sign of the direct current is inverted to return from the magnetic field strength 2004 to the magnetic field strength 2001, the excitation current is applied in a current path 2101 obtained by inverting the phase of the pattern 2. At this time, the magnetic field strength 2004 follows the path memorized in the current path 2005 to reach the magnetic field strength 2001.

A combination of the pattern 3 and the pattern 4 will be described. First, the excitation current is applied in the current path 2007 of the pattern 3. At this time, the magnetic field strength 2001 of a predetermined initial current circulates the excitation path 2008 to reach the magnetic field strength 2004. Next, in the case where the current sign of the direct current is inverted to return from the magnetic field strength 2004 to the magnetic field strength 2001, the excitation current is applied in the current path 2009 of the pattern 4. At this time, the magnetic field strength 2004 follows the path memorized in the current path 2007 to reach the magnetic field strength 2001.

Since the magnetic field responses of the three combinations shown in FIG. 21 follow the same circulating path in the first half and the second half of the combinations, the magnetic field responses can be varied reproducibly. Therefore, these three combinations are desirable as the excitation current.

As described above, when the driving timing (phase) of the direct current or the phase of the alternating current is changed at least once to control to follow the past current path, the reproducibility of the magnetic field response is improved even in the case where the current sign of the direct current is inverted.

Modified Example of the Present Invention

The present invention is not limited to the above-described embodiments, but includes various modified examples. For example, the embodiments have been described in detail for the purpose of explaining the present invention in a way that is easy to understand and are not necessarily limited to those having all the configurations described above. In addition, it is also possible to replace a part of the configuration of one embodiment with the configuration of another embodiment, and to add the configuration of one embodiment to the configuration of another embodiment. In addition, some configurations of each embodiment can be added to, deleted from, and replaced by other configurations.

The charged particle beam device to which the present invention can be applied is not limited to the scanning electron microscope shown in FIG. 1, but is also applicable to a scanning transmission electron microscope, a transmission electron microscope, a scanning ion microscope, a focused ion beam device, and the like.

LIST OF REFERENCE SIGNS 101 cathode
102 first anode
103 second anode
104 electron gun control unit
105 first condenser lens control unit
106 first condenser lens
107 objective movable diaphragm
108 second condenser lens control unit
109 second condenser lens
110 optical axis
111 objective lens control unit
112 objective lens
113 stage
114 sample
115 stage control unit
116 sample height measuring apparatus
117 retarding voltage control unit
118 retarding power supply
119 first deflector control unit
120 first scanning deflector
121 secondary electron conversion plate
122 E×B control unit
123 E×B lens
124 detector control unit
125 detector
126 control unit
127 display device
128 image shift deflector
129 astigmatic corrector control unit
130 astigmatic corrector

The invention claimed is:

1. A charged particle beam device that irradiates a sample with a charged particle beam, the device comprising:
a magnetic field lens that generates a magnetic field for changing the traveling direction of the charged particle beam; and
a current controller that controls an excitation current of the magnetic field lens,
wherein the current controller generates the excitation current by combining a direct current and an alternating current,
wherein the current controller gradually changes the current level of the direct current, and
wherein the current controller combines the alternating current with each stage of the direct current that gradually changes.

2. The charged particle beam device according to claim 1, wherein when the excitation current when the magnetic field generated by the magnetic field lens reaches a target magnetic field strength is I1 and the amplitude of the alternating current is I2, the current controller controls the alternating current so as to satisfy |I1|>|I2|.

3. The charged particle beam device according to claim 1, wherein the current controller drives the magnetic field lens by using the excitation current generated by combining the direct current and the alternating current, so that hysteresis in a fluctuation process of the excitation current and the strength of the magnetic field is suppressed.

4. The charged particle beam device according to claim 1, wherein when the excitation current is increased, the current controller gradually increases the current level of the direct current and combines the alternating current with the direct current, and
wherein when the excitation current is decreased, the current controller gradually decreases the current level of the direct current and combines the alternating current with the direct current.

5. The charged particle beam device according to claim 4, wherein when the amplitude of the alternating current is I2 and the fluctuation width of the current level of the direct current is I3, the current controller controls the direct current and the alternating current so as to satisfy |I2|≥|I3|.

6. The charged particle beam device according to claim 1, wherein the sign of the initial amplitude of the alternating current is the same as the change amount of the direct current necessary for setting the magnetic field generated by the magnetic field lens to the target magnetic field strength.

7. The charged particle beam device according to claim 1, wherein the current controller changes at least one of the phase of the direct current and the phase of the alternating current once or more when inverting the fluctuation direction of the excitation current from the increasing direction to the decreasing direction or inverting the fluctuation direction from the decreasing direction to the increasing direction.

8. The charged particle beam device according to claim 7, wherein the current controller combines the direct current with the alternating current in any one of a first rise period of the alternating current, a fall period of the alternating current, and a second rise period of the alternating current in one cycle of the alternating current, and
wherein the current controller circulates the magnetic field response of the magnetic field lens in a predetermined range by changing a period during which the direct current is combined with the alternating current or by inverting the sign of the direct current.

9. The charged particle beam device according to claim 8, wherein the current controller fluctuates the magnetic field response in a part of the predetermined range and then fluctuates the magnetic field response in the remaining part of the predetermined range after changing a period during which the direct current is combined with the alternating current or inverting the sign of the direct current, thereby circulating the magnetic field response in the predetermined range, and
wherein the current controller controls the excitation current so that a circulating path in the part and a circulating path in the remaining part follow the same circulating path.

10. The charged particle beam device according to claim 9,
wherein the current controller fluctuates the magnetic field response in the part by combining the direct current having the same sign as the initial amplitude of the alternating current with the alternating current in the first rise period, and then fluctuates the magnetic field response in the remaining part by combining the direct current having the opposite sign to the initial amplitude of the alternating current with the alternating current in the second rise period, wherein the current controller fluctuates the magnetic field response in the part by combining the direct current having the same sign as the initial amplitude of the alternating current with the alternating current in the fall period, and then fluctuates the magnetic field response in the remaining part by inverting the phase of the circulating path of the magnetic field response in the part, or wherein the current controller fluctuates the magnetic field response in the part by combining the direct current having the same sign as the initial amplitude of the alternating current with the alternating current in the second rise period, and then fluctuates the magnetic field response in the remaining part by combining the direct current having the opposite sign to the initial amplitude of the alternating current with the alternating current in the first rise period.

11. The charged particle beam device according to claim 1, wherein the current controller provides an interval period during which the alternating current is not supplied after the alternating current for one cycle is supplied as the excitation current until the alternating current for the next cycle is supplied as the excitation current, and wherein the current controller provides an interval period during which the direct current is not supplied after the direct current is supplied as the excitation current until the direct current is supplied for the next time as the excitation current.

12. The charged particle beam device according to claim 1, wherein the current controller generates the alternating current for at least one cycle or more in one cycle of the direct current.

13. The charged particle beam device according to claim 1, wherein the magnetic field lens is configured as a round lens, the charged particle beam device further comprises a controller for generating an observation image of the sample by detecting secondary particles generated when the sample is irradiated with the charged particle beam, and the current controller controls the excitation current so that a change in the sharpness of the observation image before and after applying the alternating current to the magnetic field lens falls within an allowable range, wherein the magnetic field lens is configured as a deflection lens or a multipole lens, the charged particle beam device further comprises a controller for generating an observation image of the sample by detecting secondary particles generated when the sample is irradiated with the charged particle beam, and the current controller controls the excitation current so that an image shift of the observation image before and after applying the alternating current to the magnetic field lens falls within an allowable range, or wherein the magnetic field lens is configured using a magnetically-coupled lens group, and the current controller controls the excitation current so that a change in the magnetic field response of the magnetic field lens before and after applying the alternating current to the magnetic field lens falls within an allowable range.

14. A method of controlling a charged particle beam device for irradiating a sample with a charged particle beam, wherein the charged particle beam device includes a magnetic field lens that generates a magnetic field for changing the traveling direction of the charged particle beam, wherein the method includes a step of generating an excitation current of the magnetic field lens by combining a direct current and an alternating current, wherein in the step of generating the excitation current, the current level of the direct current is gradually changed, and wherein in the step of generating the excitation current, the alternating current is combined with each stage of the direct current that gradually changes.

* * * * *